United States Patent
Hanahata et al.

(10) Patent No.: US 6,787,191 B2
(45) Date of Patent: Sep. 7, 2004

(54) COATING COMPOSITION FOR THE PRODUCTION OF INSULATING THIN FILMS

(75) Inventors: Hiroyuki Hanahata, Shizuoka (JP); Toru Araki, Fuji (JP); Mikihiko Nakamura, Fuji (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 0 days.

(21) Appl. No.: 10/240,789

(22) PCT Filed: Apr. 4, 2001

(86) PCT No.: PCT/JP01/02932

§ 371 (c)(1),
(2), (4) Date: Oct. 4, 2002

(87) PCT Pub. No.: WO01/74957

PCT Pub. Date: Oct. 11, 2001

(65) Prior Publication Data

US 2003/0099844 A1 May 29, 2003

(30) Foreign Application Priority Data

Apr. 4, 2000 (JP) ....................................... 2000-102447

(51) Int. Cl.[7] ................................................ B05D 3/02
(52) U.S. Cl. ........................ 427/387; 428/447; 524/379; 524/389; 528/25; 528/481; 106/287.13; 106/287.16
(58) Field of Search ................................ 524/379, 389; 528/25; 428/447

(56) References Cited

U.S. PATENT DOCUMENTS

| | | | |
|---|---|---|---|
| 6,271,273 B1 * | 8/2001 | You et al. ....................... | 521/61 |
| 6,399,666 B1 * | 6/2002 | Hawker et al. ................ | 521/77 |
| 6,448,331 B1 * | 9/2002 | Ioka et al. .................... | 524/859 |
| 6,451,436 B1 * | 9/2002 | Komatsu et al. ............. | 428/447 |
| 6,696,258 B1 * | 2/2004 | Wei et al. ..................... | 435/7.2 |

FOREIGN PATENT DOCUMENTS

| | | |
|---|---|---|
| EP | 0 997 497 A1 | 3/2000 |
| JP | 4-130026 A | 5/1992 |
| JP | 6-322136 A | 11/1994 |
| JP | 7-185306 A | 7/1995 |
| JP | 8-245278 A | 9/1996 |
| JP | 9-183948 A | 7/1997 |
| JP | 10-158011 A | 6/1998 |
| JP | 11-35313 A | 2/1999 |
| JP | 11-322992 A | 11/1999 |
| JP | 2000-119600 A | 4/2000 |
| JP | 2000-119601 A | 4/2000 |
| JP | 2000-290590 A | 10/2000 |
| JP | 2001-287909 A | 10/2001 |
| JP | 2001-287910 A | 10/2001 |

OTHER PUBLICATIONS

Julius F. Remenar et al., Materials Research Society, Mat. Res. Soc. Symp. Proc. vol. 511, pp. 69–74, (1998).

* cited by examiner

Primary Examiner—Margaret G. Moore
Assistant Examiner—Mark S. Zimmer
(74) Attorney, Agent, or Firm—Birch, Stewart, Kolasch & Birch, LLP

(57) ABSTRACT

Disclosed is a coating composition for use in producing an insulating thin film, comprising:

(A) at least one silica precursor comprised of at least one compound selected from the group consisting of an alkoxysilane and a hydrolysis product thereof;

(B) at least one organic polymer;

(C) water;

(D) at least one alcohol; and optionally (E) an organic solvent for a mixture of the components (A), (B), (C) and (D);

wherein the weight ratio (WR) of the water (C) to the at least one silica precursor (A) satisfies the formula $0.01 < WR < 10$, and the weight of the water (C) is larger than that of the at least one alcohol (D), with the proviso that when the at least one organic polymer (B) is insoluble in a mixture of the water (C) and the alcohol (D), the coating composition comprises all of the components (A) to (E).

13 Claims, No Drawings

COATING COMPOSITION FOR THE PRODUCTION OF INSULATING THIN FILMS

This application is the national phase under 35 U.S.C. § 371 of PCT International Application No. PCT/JP01/02932 which has an International filing date of Apr. 4, 2001, which designated the United States of America.

BACKGROUND OF THE INVENTION

1. Field of the Invention

The present invention relates to a coating composition for use in producing an insulating thin film. More particularly, the present invention is concerned with a coating composition for use in producing an insulating thin film, which comprises a silica precursor, an organic polymer, water, an alcohol and optionally an organic solvent, wherein the amounts of the water and the alcohol are in specific ranges. The present invention is also concerned with a silica/organic polymer composite thin film produced from the coating composition; a porous silica thin film obtained by removing the organic polymer from the silica/organic polymer composite thin film; a multilevel interconnect in which the porous silica thin film is used as an insulating layer; and a semiconductor device comprising the multilevel interconnect. Further, the present invention is also concerned with methods for producing the thin films.

The silica/organic polymer composite thin film and porous silica thin film of the present invention not only have an improved mechanical strength, and have insulating properties and low dielectric constant, but also exhibit excellent surface smoothness. Therefore, the silica/organic polymer composite thin film and porous silica thin film of the present invention can be advantageously used for producing an excellent multilevel interconnect, an excellent semiconductor device and the like.

2. Prior Art

Conventionally, as a material for an insulating thin film for a multilevel interconnect for a semiconductor device (such as an LSI), a high density silica material having excellent processability and heat resistance has generally been used.

In recent years, the density of the circuit of a semiconductor device (such as an LSI) has become higher and, hence, the distance between mutually adjacent conducting lines in the circuit has become extremely small. Due to this high density circuit, the mutually adjacent conducting lines having insulators therebetween function as a capacitor. This poses a problem that, when the dielectric constant of the insulator is high, the electrostatic capacity of the capacitor formed by the mutually adjacent conducting lines and the insulators present therebetween becomes high, so that the transmission of the electric signals through each of the mutually adjacent conducting lines is markedly delayed. In view of this, as a material for an insulating thin film for a multilevel interconnect, it is desired to use a material having a lower dielectric constant.

As such a material having a lower dielectric constant, a porous silica has drawn attention for the following reason. A porous silica is a composite of silica with air having a dielectric constant of 1, so that a porous silica has not only a dielectric constant which is much lower than that of a silica (from 4.0 to 4.5), but also processability and heat resistance which are comparable to those of a high density silica material. Therefore, a porous silica has drawn attention as a material for an insulating thin film.

Representative examples of porous silica materials include a silica xerogel and a silica aerogel. These porous silica materials are produced by a sol-gel reaction in which a sol (i.e., a colloid-like dispersion of particles in a liquid) is formed as an intermediate and then transformed into a gel in a solid form.

An explanation on a sol-gel reaction is made below, taking as an example a case where the sol-gel reaction is performed using an alkoxysilane compound as a raw material to thereby produce a gel. In this case, an alkoxysilane compound is subjected to hydrolysis and dehydration-condensation reactions in a solvent to obtain a dispersion of particles (having a crosslinked structure) in the solvent. This dispersion is a sol. The crosslinked particles undergo further hydrolysis and dehydration-condensation reactions in the solvent to form a solid network structure containing the solvent. This solid network structure is a gel. When the solvent is removed from the gel without bringing the solvent into a supercritical state, a silica xerogel is obtained. On the other hand, when the solvent is removed from the gel while bringing the solvent into a supercritical state, a silica aerogel is obtained.

Since, as mentioned above, a silica aerogel is obtained by removing the solvent from the gel while bringing the solvent into a supercritical state, the production of a silica aerogel requires not only a prolonged period of time but also extremely complicated steps of operations using specially designed apparatuses, so that it is practically impossible to introduce a production process for an insulating layer containing a silica aerogel thin film into the current process for producing a semiconductor device.

With respect to silica xerogel thin films, methods for the formation thereof are disclosed in several patent documents. For example, Unexamined Japanese Patent Application Laid-Open Specification No. Hei 7-257918 describes a method which comprises preparing a coating material comprising a sol of a silica precursor, coating the coating material on a substrate by spray coating, immersion coating or spin coating to form a thin film having a thickness of several microns or less on the substrate, subjecting the thin film to gelation to obtain a silica thin film, and drying the silica thin film to obtain a silica xerogel thin film.

U.S. Pat. Nos. 5,807,607 and 5,900,879 also disclose methods for forming silica xerogel thin films. In each of the methods of these patent documents, it is attempted to obtain a silica xerogel having an improved mechanical strength by a method in which a specific solvent, such as glycerol, is used in the preparation of a silica precursor sol so as to appropriately control the pore size and pore size distribution of a silica xerogel which is obtained by effecting gelation of the silica precursor sol and subsequent removal of the solvent. However, each method has the following disadvantages. In each of the methods, as a solvent, a low-boiling-point solvent is used. Therefore, rapid removal of the solvent is likely to occur during the formation of pores in the silica xerogel and, hence, wall portions surrounding the formed pores cannot stand the capillary power generated by the rapid removal of the solvent, thereby causing contraction of the pores. As a result, breakage of the pores and microcracking around the pores occur. Therefore, when an outer stress is exerted on the pores, the action of the stress is concentrated on the pores. Accordingly, the mechanical strength of the silica xerogel becomes unsatisfactory.

In the above-mentioned method, it is possible to extremely lower the rate of the removal of the solvent. However, when the rate of the removal of the solvent is extremely lowered, a very long period of time is necessary for obtaining a silica xerogel, thereby leading to a lowering of the productivity.

In view of this, for producing a silica xerogel thin film, it is attempted to use an organic polymer instead of a low-boiling-point solvent. The use of an organic polymer for producing a silica xerogel thin film is advantageous not only in that the silica xerogel thin film obtained has an improved mechanical strength, but also in that there is no need to strictly control the solvent removal rate (i.e., the solvent volatilization rate) or the atmosphere employed.

For example, Unexamined Japanese Patent Application Laid-Open Specification No. Hei 4-285081 discloses a method comprising subjecting an alkoxysilane compound to a sol-gel reaction in the presence of a specific organic polymer to produce a silica/organic polymer composite, followed by removal of the organic polymer, to thereby obtain a porous silica thin film having a uniform pore diameter.

On the other hand, in an attempt to obtain a porous silica thin film having an extremely low dielectric constant, uniform pores and a good pore size distribution, each of Unexamined Japanese Patent Application Laid-Open Specification No. Hei 5-85762 and WO99/03926 discloses a method for producing a porous silica thin film from a composition comprising an alkoxysilane and an organic polymer.

The porous silica thin films obtained by the above-mentioned methods have improved mechanical strength and low dielectric constant. However, these porous silica thin films have a problem in that the porous silica thin films do not exhibit a desired surface smoothness. On this problem, an explanation is made below.

With respect to the porous silica thin films obtained by the above-mentioned methods, the surface smoothness thereof varies depending on the types and amounts of the alkoxysilane, organic polymer and solvent used in the coating composition, coating conditions (for example, when the coating is conducted by spin coating, the coating conditions include revolution of a coater cup used, the temperature employed and the current of air), and the like. In general, the porous silica thin films obtained by the above-mentioned methods have poor surface smoothness.

In general, when the surface roughness (Ra) of an insulating thin film is about 50 Å or more (wherein the high surface roughness is used as an index for poor surface smoothness), the adhesion of the insulating thin film to an upper layer film is lowered, so that, when a semiconductor device is produced using such insulating thin film, cracks are likely to occur in the insulating thin film, or separation between the insulating thin film and the upper layer film is likely to occur. Further, when the semiconductor device comprises a multilevel interconnect, the semiconductor device suffers structural distortion throughout the semiconductor device. Therefore, in many cases, the porous silica thin films obtained by the above-mentioned methods are not practically suitable.

Thus, it has been desired to develop an insulating thin film which can be advantageously used for a practical multilevel interconnect and a practical semiconductor device and which not only has improved mechanical strength and low dielectric constant, but also exhibits excellent surface smoothness.

SUMMARY OF THE INVENTION

In this situation, the present inventors have made extensive and intensive studies with a view toward developing an silica/organic polymer composite thin film and a porous silica thin film which can be advantageously used for a practical multilevel interconnect and a semiconductor device and which not only have improved mechanical strength and low dielectric constant, but also exhibit excellent surface smoothness. As a result, it has unexpectedly been found that such a desired thin film can be obtained from a coating composition for use in producing an insulating thin film, comprising:

(A) at least one silica precursor comprising at least one compound selected from the group consisting of a specific alkoxysilane and a hydrolysis product thereof;

(B) at least one organic polymer;

(C) water;

(D) at least one alcohol; and optionally (E) an organic solvent for a mixture of the components (A), (B), (C) and (D);

wherein the weight ratio (WR) of the water (C) to the at least one silica precursor (A) satisfies the formula 0.01<WR<10, and the weight of the water (C) is larger than that of the at least one alcohol (D), with the proviso that when the at least one organic polymer (B) is insoluble in a mixture of the water (C) and the alcohol (D), the coating composition comprises all of the components (A) to (E).

Based on these findings, the present invention has been completed.

Accordingly, it is a primary object of the present invention to provide a coating composition for use in a silica/organic polymer composite thin film and a porous silica thin film which can be advantageously used for a practical multilevel interconnect and a semiconductor device and which not only have improved mechanical strength and low dielectric constant, but also exhibit excellent surface smoothness.

It is another object of the present invention to provide a method for producing the silica/organic polymer composite thin film or the porous silica thin film.

The foregoing and other objects, features and advantages of the present invention will be apparent from the following detailed description and appended claims.

DETAILED DESCRIPTION OF THE INVENTION

According to the present invention, there is provided a coating composition for use in producing an insulating thin film, comprising:

(A) at least one silica precursor selected from the group consisting of the following silica precursors (A-1) and (A-2):

a silica precursor (A-1) comprised of at least one compound selected from the group consisting of an alkoxysilane represented by the following formula (1) and a hydrolysis product thereof:

$$R^1{}_n Si(OR^2)_{4-n} \quad (1)$$

wherein each $R^1$ independently represents a hydrogen atom, a straight chain or branched alkyl group having 1 to 6 carbon atoms, a vinyl group or a phenyl group, each $R^2$ independently represents a straight chain or branched alkyl group having 1 to 6 carbon atoms and n represents an integer of from 0 to 3; and a silica precursor (A-2) comprised of at least one compound selected from the group consisting of an alkoxysilane represented by the following formula (2) and a hydrolysis product thereof:

$$R^3_m(R^4O)_{3-m}Si-(R^7)_p-Si(OR^5)_{3-q}R^6_q \quad (2)$$

wherein each $R^3$ independently represents a hydrogen atom, a straight chain or branched alkyl group having 1 to 6 carbon atoms, a vinyl group or a phenyl group, each $R^4$ independently represents a straight chain or branched alkyl group having 1 to 6 carbon atoms, each $R^5$ independently represents a straight chain or branched alkyl group having 1 to 6 carbon atoms, each $R^6$ independently represents a hydrogen atom, a straight chain or branched alkyl group having 1 to 6 carbon atoms, a vinyl group or a phenyl group, $R^7$ represents an oxygen atom, a phenylene group or a group represented by the formula: $-(CH_2)_r-$ wherein r represents an integer of from 1 to 6, each of m and q independently represents an integer of from 0 to 2, and p represents 0 or 1;

(B) at least one organic polymer;
(C) water;
(D) at least one alcohol; and optionally
(E) an organic solvent for a mixture of the components (A), (B), (C) and (D);

wherein the weight ratio (WR) of the water (C) to the at least one silica precursor (A) satisfies the formula 0.01<WR<10, and the weight of the water (C) is larger than that of the at least one alcohol (D), with the proviso that when the at least one organic polymer (B) is insoluble in a mixture of the water (C) and the alcohol (D), the coating composition comprises all of the components (A) to (E).

For easy understanding of the present invention, the essential features and various preferred embodiments of the present invention are enumerated below.

1. A coating composition for use in producing an insulating thin film, comprising:

(A) at least one silica precursor selected from the group consisting of the following silica precursors (A-1) and (A-2):

a silica precursor (A-1) comprised of at least one compound selected from the group consisting of an alkoxysilane represented by the following formula (1) and a hydrolysis product thereof:

$$R^1_n Si(OR^2)_{4-n} \quad (1)$$

wherein each $R^1$ independently represents a hydrogen atom, a straight chain or branched alkyl group having 1 to 6 carbon atoms, a vinyl group or a phenyl group, each $R^2$ independently represents a straight chain or branched alkyl group having 1 to 6 carbon atoms and n represents an integer of from 0 to 3; and a silica precursor (A-2) comprised of at least one compound selected from the group consisting of an alkoxysilane represented by the following formula (2) and a hydrolysis product thereof:

$$R^3_m(R^4O)_{3-m}Si-(R^7)_p-Si(OR^5)_{3-q}R^6_q \quad (2)$$

wherein each $R^3$ independently represents a hydrogen atom, a straight chain or branched alkyl group having 1 to 6 carbon atoms, a vinyl group or a phenyl group, each $R^4$ independently represents a straight chain or branched alkyl group having 1 to 6 carbon atoms, each $R^5$ independently represents a straight chain or branched alkyl group having 1 to 6 carbon atoms, each $R^6$ independently represents a hydrogen atom, a straight chain or branched alkyl group having 1 to 6 carbon atoms, a vinyl group or a phenyl group, $R^7$ represents an oxygen atom, a phenylene group or a group represented by the formula: $-(CH_2)_r-$ wherein r represents an integer of from 1 to 6, each of m and q independently represents an integer of from 0 to 2, and p represents 0 or 1;

(B) at least one organic polymer;
(C) water;
(D) at least one alcohol; and optionally
(E) an organic solvent for a mixture of the components (A), (B), (C) and (D);

wherein the weight ratio (WR) of the water (C) to the at least one silica precursor (A) satisfies the formula 0.01<WR<10, and the weight of the water (C) is larger than that of the at least one alcohol (D), with the proviso that when the at least one organic polymer (B) is insoluble in a mixture of the water (C) and the alcohol (D), the coating composition comprises all of the components (A) to (E).

2. The composition according to item 1 above, wherein the weight ratio (WR) satisfies the formula 0.1<WR<10.

3. The composition according to item 1 or 2 above, wherein the weight ratio of the water (C) to the alcohol (D) is 5 or less.

4. The composition according to item 1 above, wherein the organic polymer (B) is at least one member selected from the group consisting of:

(B-1) an organic polymer having at least one polymerizable functional group in a molecule thereof; and
(B-2) an organic polymer having at least one terminal group which is inert to the silica precursor (A).

5. The composition according to item 4 above, wherein the terminal group of the organic polymer (B-2) is an alkyl ether group.

6. The composition according to item 1 above, wherein the organic polymer (B) has a number average molecular weight of from 200 to 1,000,000.

7. The composition according to item 1 above, wherein the organic polymer (B) is present in an amount of from 0.01 to 10 parts by weight, relative to 1 part by weight of a product obtained by gelation of the whole amount of the silica precursor (A).

8. The composition according to item 1 above, which further comprises phosphoric acid.

9. The composition according to item 8 above, wherein the silica precursor (A) has at least one Si—O—P— linkage.

10. A silica/organic polymer composite thin film, which is produced by a process comprising:

coating the composition of item 1 above on a substrate to form a thin film of the composition on the substrate, and subjecting the thin film to gelation with respect to the silica precursor (A) to thereby obtain a silica/organic polymer composite thin film.

11. A porous silica thin film which is obtained by removing the organic polymer (B) from the silica/organic polymer composite thin film of item 10 above.

12. A multilevel interconnect comprising a plurality of insulating layers and circuits formed on the insulating layers, wherein at least one layer of the insulating layers comprises the thin film of item 10 or 11 above.

13. A semiconductor device comprising the multilevel interconnect of item 12 above.

14. A method for producing a porous silica thin film, which comprises the steps of:
(1) coating the composition of item 1 above on a substrate to form a thin film of the composition on the substrate,
(2) heating the thin film at a temperature $T_1$ satisfying the formula $60° C. \leq T_1 \leq Ta$ in an atmosphere of inert gas having an oxygen concentration of not higher than 5% by volume, wherein Ta represents the temperature at which a 1% by weight decrease in weight of the at least one organic polymer (B) is reached when the at least one organic polymer (B) is heated at a temperature elevation rate of 10° C./min in an atmosphere of inert gas, wherein the inert gas is fed at a feeding rate of 40 ml/mm, to thereby effect gelation of the silica precursor (A) and obtain a silica/organic polymer composite thin film, and
(3) heating the composite thin film at a temperature $T_2$ satisfying the formula $Ta \leq T_2 \leq 450°$ C. wherein Ta is as defined above, in an atmosphere of inert gas having an oxygen concentration of not higher than 5% by volume, to thereby remove the organic polymer (B) from the composite thin film.

Hereinbelow, the present invention is described in detail.
The coating composition of the present invention essentially comprises at least one silica precursor (A), at least one organic polymer (B), water (C), at least one alcohol (D). The coating composition may optionally further comprise an organic solvent (E).

With respect to the at least one silica precursor (A), an explanation is made below. The silica precursor (A) is at least one silica precursor selected from the group consisting of the following silica precursors (A-1) and (A-2):
a silica precursor (A-1) comprised of at least one compound selected from the group consisting of an alkoxysilane represented by the following formula (1) and a hydrolysis product thereof:

$$R^1{}_nSi(OR^2)_{4-n} \qquad (1)$$

wherein each $R^1$ independently represents a hydrogen atom, a straight chain or branched alkyl group having 1 to 6 carbon atoms, a vinyl group or a phenyl group, each $R^2$ independently represents a straight chain or branched alkyl group having 1 to 6 carbon atoms and n represents an integer of from 0 to 3; and
a silica precursor (A-2) comprised of at least one compound selected from the group consisting of an alkoxysilane represented by the following formula (2) and a hydrolysis product thereof:

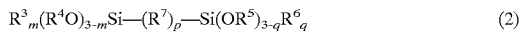

$$R^3{}_m(R^4O)_{3-m}Si-(R^7)_p-Si(OR^5)_{3-q}R^6{}_q \qquad (2)$$

wherein each $R^3$ independently represents a hydrogen atom, a straight chain or branched alkyl group having 1 to 6 carbon atoms, a vinyl group or a phenyl group, each $R^4$ independently represents a straight chain or branched alkyl group having 1 to 6 carbon atoms, each $R^5$ independently represents a straight chain or branched alkyl group having 1 to 6 carbon atoms, each $R^6$ independently represents a hydrogen atom, a straight chain or branched alkyl group having 1 to 6 carbon atoms, a vinyl group or a phenyl group, $R^7$ represents an oxygen atom, a phenylene group or a group represented by the formula: $-(CH_2)_r-$ wherein r represents an integer of from 1 to 6, each of m and q independently represents an integer of from 0 to 2, and p represents 0 or 1.

With respect to the alkoxysilane represented by the formula (1) above, an explanation is made below. The alkoxysilane represented by the formula (1) wherein n is 0, that is, the alkoxysilane represented by the formula: $Si(OR^2)_4$ is referred to as an alkoxysilane having four functionalities. The alkoxysilane represented by the formula (1) wherein n is 1, that is, the alkoxysilane represented by the formula: $R^1Si(OR^2)_3$ is referred to as an alkoxysilane having three functionalities. The alkoxysilane represented by the formula (1) wherein n is 2, that is, the alkoxysilane represented by the formula: $R^1{}_2Si(OR^2)_2$ is referred to as an alkoxysilane having two functionalities. The alkoxysilane represented by the formula (1) wherein n is 3, that is, the alkoxysilane represented by the formula: $R^1{}_3Si(OR^2)$ is referred to as an alkoxysilane having one functionality.

Specific examples of alkoxysilanes which are represented by the formula (1) and have four functionalities include tetramethoxysilane, tetraethoxysilane, tetra-n-propoxysilane, tetraisopropoxysilane, tetra-n-butoxysilane, tetra-sec-butoxysilane and tetra-tert-butoxysilane.

Specific examples of alkoxysilanes which are represented by the formula (1) and have three functionalities include trimethoxysilane, triethoxysilane, methyltrimethoxysilane, methyltriethoxysilane, ethyltrimethoxysilane, ethyltriethoxysilane, propyltrimethoxysilane, propyltriethoxysilane, isobutyltriethoxysilane, cyclohexyltrimethoxysilane, phenyltrimethoxysilane, phenyltriethoxysilane, vinyltrimethoxysilane, vinyltriethoxysilane, allyltrimethoxysilane, allyltriethoxysilane, methyltri-n-propoxysilane, methyltriisopropoxysilane, methyltri-n-butoxysilane, methyltri-sec-butoxysilane, methyltri-tert-butoxysilane, ethyl-tri-n-propoxysilane, ethyltriisopropoxysilane, ethyl-tri-n-butoxysilane, ethyltri-sec-butoxysilane, ethyl-tri-tert-butoxysilane, n-propyltri-n-propoxysilane, n-propyltriisopropoxysilane, n-propyltri-n-butoxysilane, n-propyltri-sec-butoxysilane, n-propyltri-tert-butoxysilane, isopropyltrimethoxysilane, isopropyl-triethoxysilane, isopropyltri-n-propoxysilane, isopropyltriisopropoxysilane, isopropyltri-n-butoxysilane, isopropyltri-sec-butoxysilane, isopropyltri-tert-butoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltri-n-propoxysilane, sec-butyltriisopropoxysilane, sec-butyltri-sec-butoxysilane, sec-butyltri-tert-butoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, phenyl-tri-n-propoxysilane, phenyltriisopropoxysilane, phenyl-tri-n-butoxysilane, phenyltri-sec-butoxysilane and phenyltri-tert-butoxysilane.

As an example of alkoxysilanes which are represented by the formula (1) above and have two functionalities, there can be mentioned an alkoxysilane having, bonded to the silicon atom thereof, two groups selected from the group consisting of an alkyl group and a phenyl group. Specific examples of such alkoxysilanes include dimethyldimethoxysilane, dimethyldiethoxysilane, diphenyldimethoxysilane, diphenyldiethoxysilane, diethyldimethoxysilane, diethyldiethoxysilane, methylethyldimethoxysilane, methylethyldiethoxysilane, methylphenyldimethoxysilane, methylphenyldiethoxysilane, ethylphenyldimethoxysilane and ethylphenyldiethoxysilane.

Of these alkoxysilanes, especially preferred are tetramethoxysilane, tetraethoxysilane, trimethoxysilane, triethoxysilane, methyltrimethoxysilane, methyltriethoxysilane, dimethyldimethoxysilane and dimethyldiethoxysilane.

As an example of alkoxysilanes which are represented by the formula (1) above and have one functionality, there can be mentioned an alkoxysilane having, bonded to the silicon atom thereof, three groups selected from the group consisting of a hydrogen atom, an alkyl group, a vinyl group and a phenyl group. Specific examples of such alkoxysilanes include trimethylmethoxysilane, trimethylethoxysilane, triphenylmethoxysilane, triphenylethoxysilane, methyldiethoxysilane, dimethylvinylmethoxysilane, dimethylvinylethoxysilane, phenyldimethylmethoxysilane, phenyldimethylethoxysilane, diphenylmethylmethoxysilane and diphenylmethylethoxysilane.

In general, the above-mentioned alkoxysilanes having one functionality are used for modifying the silica/organic polymer composite thin film or a porous silica thin film. The amount of the alkoxysilane having one functionality is 80 mol % or less, based on the total molar amount of the alkoxysilanes contained in the silica precursor (A). When the amount of the alkoxysilane having one functionality is more than 80 mol %, it is possible that gelation of the silica precursor (A) does not occur.

Further, for improving the crosslinking density of the silica precursor (A), it is possible to incorporate into the silica precursor (A) an organic compound having a plurality of trialkoxysilyl groups bonded to a carbon atom thereof.

With respect to the alkoxysilane represented by the formula (2) above, an explanation is made below. When the sum (i.e., 6-m-q) of the number of $R^4O$ and the number of $OR^5$ in the formula (2) is k, the alkoxysilane represented by the formula (2) is referred to as an alkoxysilane having k functionalities. For example, the alkoxysilane represented by the formula (2) wherein m=q=2, that is, the alkoxysilane represented by the formula: $R^3{}_2(R^4O)Si—(R^7)_p—Si(OR^5)R^6{}_2$, is an alkoxysilane having two functionalities. Each of the alkoxysilane represented by the formula (2) wherein m=2 and q=1, that is, the alkoxysilane represented by the formula: $R^3{}_2(R^4O)Si—(R^7)_p—Si(OR^5)_2R^6{}_2$, and the alkoxysilane represented by the formula (2) wherein m=1 and q=2, that is, the alkoxysilane represented by the formula: $R^3(R^4O)_2Si—(R^7)_p—Si(OR^5)R^6{}_2$, is an alkoxysilane having three functionalities. The alkoxysilane represented by the formula (2) wherein m=q=1, that is, the alkoxysilane represented by the formula: $R^3(R^4O)_2Si—(R^7)_p—Si(OR^5)_2R^6$, is an alkoxysilane having four functionalities. Each of the alkoxysilane represented by the formula (2) wherein m=0 and q=1, that is, the alkoxysilane represented by the formula: $(R^4O)_3Si—(R^7)_p—Si(OR^5)_2R^6$, and the alkoxysilane represented by the formula (2) wherein m=1 and q=0, that is, the alkoxysilane represented by the formula: $R^3(R^4O)_2Si—(R^7)_p—Si(OR^5)_3$, is an alkoxysilane having five functionalities. The alkoxysilane represented by the formula (2) wherein m=q=0, that is, the alkoxysilane represented by the formula: $(R^4O)_3Si—(R^7)_p—Si(OR^5)_3$, is an alkoxysilane having six functionalities.

With respect to the alkoxysilane which is represented by the formula (2) above wherein p=1 and $R^7$ is a phenylene group or a group represented by the formula: $—(CH_2)_r—$ and which has two, four or six functionalities, specific examples thereof include bis(trimethoxysilyl)methane, bis(triethoxysilyl)methane, bis(triphenoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, bis(ethoxydiphenylsilyl)methane, bis(trimethoxysilyl)ethane, bis(triethoxysilyl)ethane, bis(triphenoxysilyl)ethane, bis(dimethoxymethylsilyl)ethane, bis(diethoxymethylsilyl)ethane, bis(dimethoxyphenylsilyl)ethane, bis(diethoxyphenylsilyl)ethane, bis(methoxydimethylsilyl)ethane, bis(ethoxydimethylsilyl)ethane, bis(methoxydiphenylsilyl)ethane, bis(ethoxydiphenylsilyl)ethane, 1,3-bis(trimethoxysilyl)propane, 1,3-bis(triethoxysilyl)propane, 1,3-bis(triphenoxysilyl)propane, 1,3-bis(dimethoxymethylsilyl)propane, 1,3-bis(diethoxymethylsilyl)propane, 1,3-bis(dimethoxyphenylsilyl)propane, 1,3-bis(diethoxyphenylsilyl)propane, 1,3-bis(methoxydimethylsilyl)propane, 1,3-bis(ethoxydimethylsilyl)propane, 1,3-bis(methoxydiphenylsilyl)propane, 1,3-bis(ethoxydiphenylsilyl)propane, 1,4-bis(trimethoxysilyl)benzene and 1,4-bis(triethoxysilyl)benzene.

Specific examples of alkoxysilanes represented by the formula (2) above wherein p=1 and $R^7$ is an oxygen atom include hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentamethoxy-3-phenyldisiloxane, 1,1,1,3,3-pentaethoxy-3-phenyldisiloxane, 1,1,3,3-tetramethoky-1,3-dimethyldisiloxane, 1,1,3,3-tetraethoxy-1,3-dimethyldisiloxane, 1,1,3,3-tetramethoxy-1,3-diphenyldisiloxane, 1,1,3,3-tetraethoxy-1,3-diphenyldisiloxane, 1,1,3-trimethoxy-1,3,3-trimethyldisiloxane, 1,1,3-triethoxy-1,3,3-trimethyldisiloxane, 1,1,3-trimethoxy-1,3,3-triphenyldisiloxane, 1,1,3-triethoxy-1,3,3-triphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane and 1,3-diethoxy-1,1,3,3-tetraphenyldisiloxane.

With respect to the alkoxysilane which is represented by the formula (2) above wherein p=0 and which has two, four or six functionalities, specific examples thereof include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentamethoxy-2-phenyldisilane, 1,1,1,2,2-pentaethoxy-2-phenyldisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,1,2,2-tetraethoxy-1,2-diphenyldisilane, 1,1,2-trimethoxy-1,2,2-trimethyldisilane, 1,1,2-triethoxy-1,2,2-trimethyldisilane, 1,1,2-trimethoxy-1,2,2-triphenyldisilane, 1,1,2-triethoxy-1,2,2-triphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane and 1,2-diethoxy-1,1,2,2-tetraphenyldisilane.

The silica precursor (A-1) may contain a dehydration-condensation reaction product of a hydrolysis product of an alkoxysilane, wherein the hydrolysis product is one form of the silica precursor (A-1). The silica precursor (A-2) may also contain a dehydration-condensation product of a hydrolysis product of an alkoxysilane, wherein the hydrolysis product is one form of the silica precursor (A-2). In the silica precursor (A), with respect to the respective ratios of the alkoxysilane, a hydrolysis product of the alkoxysilane, and a dehydration-condensation product of the hydrolysis product, there is no particular limitation so long as the dehydration-condensation reaction has not advanced to too large an extent such that the amount of the dehydration-condensation reaction product obtained by gelation of the silica precursor (A) becomes 80% by weight or more, based on the weight of the original silica precursor (A). In the present invention, the term "hydrolysis product of an alkoxysilane" means either the complete hydrolysis product of the alkoxysi—the the alkoxysilane or a partial hydrolysis product of the alkoxysilane.

In the present invention, the term "silica" means one which is comprised mainly of a compound represented by the following formula (3):

$$R_xH_ySiO_z \qquad (3)$$

wherein R represents a straight chain, branched or cyclic alkyl group having 1 to 8 carbon atoms or an aryl group, and x, y and z satisfy the following relationships:

$0 \leq x < 2$, $0 \leq y < 2$, $0 \leq (x+y) < 2$, and $1 < z \leq 2$.

With respect to the at least one organic polymer (B), an explanation is made below. With respect to the organic polymer (B), there is no particular limitation; however, it is preferred that the organic polymer (B) is at least one member selected from the group consisting of:

(B-1) an organic polymer having at least one polymerizable functional group in a molecule thereof; and (B-2) an organic polymer having at least one terminal group which is inert to the silica precursor (A).

Specific examples of organic polymers (B-1) include those polymers which mainly comprise a member selected from the group consisting of a polyether, a polyester, a polycarbonate, a polyanhydride, a polyamide, a polyurethane, a polyurea, a polyacrylic acid, a polyacrylate, a polymethacrylic acid, a polymethacrylate, a polyacrylamide, a polymethacrylamide, a polyacrylonitrile, a polymethacrylonitrile, a polyolefin, a polydiene, a polyvinyl ether, a polyvinylketone, a polyvinylamide, a polyvinylamine, a polyvinyl ester, a polyvinyl alcohol, a polyvinyl halide, a polyvinylidene halide, a polystyrene, a polysiloxane, a polysulfide, a polysulfone, a polyimine, a polyimide, cellulose, and derivatives thereof.

Further, the organic polymer (B-1) may be either a copolymer of different monomers used for forming the above-mentioned polymers, or a copolymer of at least one of monomers used for forming the above-mentioned polymers with another monomer.

These organic polymers can be used individually or in combination.

Of these organic polymers, preferred are polymers which mainly comprise a member selected from the group consisting of a polyether, a polyester, a polycarbonate, a polyanhydride, a polyamide, a polyurethane, a polyurea, a polyacrylic acid, a polyacrylate, a polymethacrylic acid, a polymethacrylate, a polyacrylamide, a polymethacrylamide, a polyvinylamide, a polyvinylamine, a polyvinyl ester, a polyvinyl alcohol, a polyimine and a polyimide.

From the viewpoint of efficient production of porous silica thin films by using the coating composition of the present invention, it is especially preferred to use polymers which mainly comprise a member selected from the group consisting of an aliphatic polyether, an aliphatic polyester, an aliphatic polycarbonate and an aliphatic polyanhydride, which have low heat decomposition temperatures.

Examples of polymerizable functional groups include a vinyl group, a vinylidene group, a vinylene group, a glycidyl group, an allyl group, an acryloyl group, a methacryloyl group, an acrylamide group, a methacrylamide group, a carboxyl group, a hydroxyl group, an isocyanate group, an amino group, an imino group and a halogen atom-containing group.

These polymerizable functional groups may be positioned in a main chain or a side chain of the polymer or at a terminal of the polymer. Further, the polymerizable functional groups may be either directly linked to a polymer chain of the polymer, or indirectly linked to the polymer chain through a spacer, such as an alkylene group or an ether group. In the polymer, a single molecule thereof may have a single type of functional group or two or more different types of functional groups.

Of the above-mentioned functional groups, preferred are a vinyl group, a vinylidene group, a vinylene group, a glycidyl group, an allyl group, an acryloyl group, a methacryloyl group, an acrylamide group and a methacrylamide group.

With respect to preferred organic polymers (B-1), specific examples of basic skeletons thereof are enumerated below (wherein in the following enumeration, the term "alkylene" means any one of "methylene", "ethylene", "propylene", "trimethylene", "tetramethylene", "pentamethylene", "hexamethylene", "isopropylidene", "1,2-dimethylethylene" and "2,2-dimethytrimethylene"; the term "alkyl" means an alkyl group having 1 to 8 carbon atoms; the term "aryl" means, for example, a phenyl group, a tolyl group, an anisyl group or the like; the term "(meth)acrylate" means both an acrylate and a methacrylate; and the term "dicarboxylic acid" means an organic acid, such as oxalic acid, malonic acid, succinic acid, glutaric acid, adipic acid, pimelic acid, suberic acid, azelaic acid or sebacic acid):

(a) aliphatic polyethers having a polymerizable functional group (such as an acryloyl group, a methacryloyl group, a vinyl group or a glycidyl group) at their respective terminals, such as a polyalkylene glycol (meth)acrylate, a polyalkylene glycol di(meth)acrylate, a polyalkylene glycol alkyl ether (meth)acrylate, a polyalkylene glycol vinyl ether, a polyalkylene glycol divinyl ether, a polyalkylene glycol alkyl ether vinyl ether, a polyalkylene glycol glycidyl ether, a polyalkylene glycol diglycidyl ether and a polyalkylene glycol alkyl ether glycidyl ether;

(b) polycaprolactones having a polymerizable functional group (such as an acryloyl group, a methacryloyl group, a vinyl group or a glycidyl group) at their respective one or both terminals, such as a polycaprolactone (meth)acrylate, a polycaprolactone vinyl ether, a polycaprolactone glycidyl ether, a polycaprolactone vinyl ester, a polycaprolactone glycidyl ester, a polycaprolactone vinyl ester (meth)acrylate, a polycaprolactone glycidyl ester (meth)acrylate, a polycaprolactone vinyl ester vinyl ether, a polycaprolactone glycidyl ester vinyl ether, a polycaprolactone vinyl ester glycidyl ether and a polycaprolactone glycidyl ester glycidyl ether;

(c) (meth)acrylic esters, di(meth)acrylic esters, tri(meth)acrylic esters, vinyl ethers, divinyl ethers, trivinyl ethers, glycidyl ethers, diglycidyl ethers, and triglycidyl ethers of a polycaprolactone triol;

(d) aliphatic polyesters which are obtained by copolymerization of a dicarboxylic acid with a polyalkylene glycol and which have a polymerizable functional group (such as an acryloyl group, a methacryloyl group, a vinyl group or a glycidyl group) at their respective one or both terminals;

(e) aliphatic polyalkylene carbonates having a polymerizable functional group (such as an acryloyl group, a methacryloyl group, a vinyl group or a glycidyl group) at their respective one or both terminals;

(f) aliphatic polyanhydrides which are obtained by polymerization of a dicarboxylic anhydride and which have a polymerizable functional group (such as an acryloyl group, a methacryloyl group, a vinyl group or a glycidyl group) at their respective terminals;

(g) polyacrylates and polymethacrylates having a functional group (such as a vinyl group, a glycidyl group or an allyl group) in their respective side chains, such as a polyglycidyl (meth)acrylate, a polyallyl (meth) acrylate and a polyvinyl meth)acrylate; and (h) polyvinyl cinnamates, polyvinyl azido benzals, epoxy resins and the like.

From the viewpoint of efficient production of porous silica thin films by using the coating composition of the present invention, among the above-mentioned polymers, especially preferred are an aliphatic polyether, an aliphatic polyester, an aliphatic polycarbonate and an aliphatic polyanhydride (which are described in items (a) to (f) above), which have low heat decomposition temperatures.

With respect to the organic polymer (B-2), an explanation is made below.

The organic polymer (B-2) has at least one terminal group which is inert to the silica precursor (A). Therefore, when the organic polymer (B-2) is used as the organic polymer (B), it is possible to lower the temperature at which the organic polymer is removed from the silica/organic polymer composite thin film. Preferred examples of such inert terminal groups include an alkyl ether group, an alkyl ester group, an alkylamide group and an alkyl carbonate group, each of which is a straight chain, branched or cyclic group having 1 to 8 carbon atoms.

With respect to the main chain structure of the organic polymer (B-2), there is no particular limitation. Specific examples of organic polymers (B-2) include polymers which mainly comprise a member selected from the group consisting of a polyether, a polyester, a polycarbonate, a polyanhydride, a polyamide, a polyurethane, a polyurea, a polyacrylic acid, a polyacrylate, a polymethacrylic acid, a polymethacrylate, a polyacrylamide, a polymethacrylamide, a polyacrylonitrile, polymethacrylonitrile, a polyolefin, a polydiene, a polyvinyl polyvinyl ether, a polyvinylketone, a polyvinylamide, a polyvinylamine, a polyvinyl ester, a polyvinyl alcohol, a polyvinyl halide, a polyvinylidene halide, a polystyrene, a polysiloxane, a polysulfide, a polysulfone, a polyimine, a polyimide, cellulose, and derivatives thereof.

Further, the organic polymer (B-2) may be either a copolymer of different monomers used for forming the above-mentioned polymers, or a copolymer of at least one of monomers used for forming the above-mentioned polymers with another monomer.

These organic polymers can be used individually or in combination.

From the viewpoint of efficient production of porous silica thin films by using the coating composition of the present invention, among the above-mentioned organic polymers, especially preferred are polymers which mainly comprise a member selected from the group consisting of an aliphatic polyether, an aliphatic polyester, an aliphatic polycarbonate and an aliphatic polyanhydride, which have low heat decomposition temperatures.

The main chain of the organic polymer (B) may contain a polymer chain comprising recurring units other than mentioned above so long as the effects of the present invention are not adversely affected.

Since the above-mentioned terminal groups have an excellent compatibility with the silica precursor (A), it is preferred that the organic polymer (B-2) has a number of such terminal groups. In this case, the compatibility of the organic polymer (B-2) with the silica precursor (A) is improved, so that the silica/organic polymer composite thin film has an improved homogeneity. As a result, the surface smoothness of the silica/organic polymer composite is enhanced.

In view of this, it is preferred that the organic polymer (B-2) has a branched structure which enables the organic polymer (B-2) to contain more terminal groups.

In such a case, it is preferred that the branched part of the organic polymer (B-2) has a structure wherein a polymer chain of the organic polymer (B-2) is linked to at least three hydroxyl groups possessed by a saccharide, such as glycerol, erythritol, erythrose, pentaerythritol, a pentitol, a pentose, a hexitol, a hexose, a heptose or the like, and/or linked to at least three groups selected from the group consisting of a hydroxyl group and a carboxyl group, each of which is contained in a hydroxy acid.

Specific examples of saccharides include glycerol, erythritol, sorbitol, mannitol, xylitol, threitol, maltitol, arabitol, lactitol, adonitol, cellobiose, glucose, fructose, sucrose, lactose, mannose, galactose, erythrose, xylulose, allulose, ribose, sorbose, xylose, arabinose, isomaltose, dextrose and glucoheptose.

Specific examples of hydroxy acids include citric acid, malic acid, tartaric acid, gluconic acid, glucuronic acid, glucoheptonic acid, glucooctanic acid, threonine acid, saccharic acid, galactonic acid, galactaric acid, galacturonic acid, glyceric acid and hydroxysuccinic acid.

Examples of aliphatic polyethers include those which have a main chain comprising a polyalkylene glycol, such as a polyethylene glycol, a polypropylene glycol, a polyisobutylene glycol, a polytrimethylene glycol, a polytetramethylene glycol, a polypentamethylene glycol, a polyhexamethylene glycol, a polydioxolane, a polydioxepane, or a polyethylene/polypropylene glycol block copolymer. These aliphatic polyethers may have at least one terminal group modified with an alkyl ether group, an alkyl ester group, an alkylamide group, an alkylcarbonate group, a urethane group or a trialkylsilyl group, wherein each of the alkyl ether group, alkyl ester group, alkylamide group and alkylcarbonate group may be either directly linked to the recurring unit positioned at the terminal of the polymer, or indirectly linked to the recurring unit positioned at the terminal of the polymer through an organic group.

Examples of aliphatic polyethers which have a terminal group modified with an ether group include an aliphatic polyether having a main chain comprising the above-mentioned polyalkylene glycol, wherein at least one terminal of the polyalkylene glycol is modified with an ether, such as methyl ether, ethyl ether, propyl ether or glycidyl ether. Preferred specific examples of such aliphatic polyethers include a polyethylene glycol monomethyl ether, a polyethylene glycol dimethyl ether, a polypropylene glycol dimethyl ether, a polyisobutylene glycol dimethyl ether, a polyethylene glycol diethyl ether, a polyethylene glycol monoethyl ether, a polyethylene glycol dibutyl ether, a polyethylene glycol monobutyl ether, a polyethylene glycol diglycidyl ether, a polyethylene polypropylene glycol dimethyl ether, a glycerol polyethylene glycol trimethyl ether, a pentaerythritol polyethylene glycol tetramethyl ether, a pentitol polyethylene glycol pentamethyl ether and a sorbitol polyethylene glycol hexamethyl ether.

Examples of aliphatic polyethers which have a terminal group modified with an ester group include an aliphatic polyether having a main chain comprising the above-mentioned polyalkylene glycol, wherein at least one terminal of the polyalkylene glycol is modified with an ester, such as an acetic ester, a propionic ester, an acrylic ester, a methacrylic ester, or a benzoic ester. It is also preferred that the terminal of the polyalkylene glycol is modified with a carboxymethyl ether, and a carboxyl group of the terminal which have been modified with a carboxymethyl ether is modified with an alkyl ether. Specific preferred examples of such aliphatic polyethers include a polyethylene glycol monoacetate, a polyethylene glycol diacetate, a polypropylene glycol monoacetate, a polypropylene glycol diacetate, a polyethylene glycol dibenzoate, a polyethylene glycol diacrylate, a polyethylene glycol monomethacrylate, a polyethylene glycol dimethacrylate, a polyethylene glycol biscarboxymethyl ether dimethyl ester, a polypropylene glycol biscarboxymethyl ether dimethyl ester, a glyxerol polyethylene glycol triacetate, a pentaerythritol polyethylene glycol tetraacetate, a pentitol polyethylene glycol pentaacetate and a sorbitol polyethylene glycol hexaacetate.

Examples of aliphatic polyethers which have a terminal amide group include those which are obtained by a method comprising modifying at least one terminal of the above-mentioned polyalkylene glycol with a carboxymethyl ether, followed by amidation; and those which are obtained by a method comprising modifying at least one terminal of the above-mentioned polyalkylene glycol with a carboxymethyl ether and effecting amination of the resultant terminal hydroxyl group, followed by amidation.

Specific preferred examples of such aliphatic polyethers include a polyethylene glycol bis(carboxymethyl ether dimethylamide), a polypropylene glycol bis(carboxymethyl ether dimethylamide), a polyethylene glycol bis(carboxymethyl ether diethylamide), a glycerol polyethylene glycol tri(carboxymethyl ether dimethylamide), a pentaerythritol polyethylene glycol tetra(carboxymethyl ether dimethylamide), a pentitol polyethylene glycol penta(carboxymethyl ether dimethylamide) and a sorbitol polyethylene glycol hexa(carboxymethyl ether dimethylamide).

Examples of aliphatic polyethers which have a terminal alkylcarbonate group include those which are obtained by bonding a formyl ester group to at least one terminal of the above-mentioned polyalkylene glycol. Specific examples of such aliphatic polyethers include a bismethoxycarbonyloxy polyethylene glycol, a bisethoxycarbonyloxy polyethylene glycol, a bisethoxycarbonyloxy polypropylene glycol and a bis(tert-butyoxycarbonyloxy) polyethylene glycol.

Further, there can be used aliphatic polyethers which have a terminal group modified with a urethane group or a trialkylsilyl group. With respect to the modification with a trialkylsilyl group, especially preferred is a modification with a trimethylsilyl group. Such a modification can be conducted by using trimethylchlorosilane, trimethylchlorosilylacetoamido, hexamethyldisilazane or the like.

Examples of aliphatic polyesters include polycondensation products of a hydroxycarboxylic acid, such as a polyglycolide; ring-opening polymerization reaction products of a lactone, such as a polycaprolactone and a polypivalolactone; polycondensation products of a carboxylic acid with an alkylene glycol, such as a polyethylene oxalate, a polyethylene succinate, a polyethylene adipate, a polyethylene sebacate, a polypropylene adipate and a polyoxydiethylene adipate; and ring-opening polymerization reaction products of an epoxide with an acid anhydride, wherein each of the above-mentioned polymers has at least one terminal thereof modified with an alkyl ether group, an alkyl ester group, an alkylamide group, an alkylcarbonate group, a urethane group or a trialkylsilyl group.

Examples of aliphatic polycarbonates include those which have a main chain comprising a polycarbonate, such as a polyethylene carbonate, a polypropylene carbonate, a polypentamethylene carbonate or a polyhexamethylene carbonate, wherein each of the above-mentioned polymers has at least one terminal thereof modified with an alkyl ether group, an alkyl ester group, an alkylamide group, an alkylcarbonate group, a urethane group or a trialkylsilyl group.

Examples of aliphatic polyanhydrides include those which have a main chain comprising a polycondensation product of a dicarboxylic acid, such as a polymalonyl oxide, a polyadipoyl oxide, a polypimeloyl oxide, a polysuberoyl oxide, a polyazelaoyl oxide or a polysebacoyl oxide, wherein each of the polymers has at least one terminal thereof modified with an alkyl ether group, an alkyl ester group, an alkylamide group, an alkylcarbonate group, a urethane group or a trialkylsilyl group.

In the present invention, the term "alkylene glycol" means a dihydric alcohol obtained by substituting an alkane having two or more carbon atoms with two hydroxyl groups so that two hydrogen atoms bonded to different carbon atoms in the alkanes are replaced by the hydroxyl groups. The term "dicarboxylic acid" means an organic acid having two carboxyl groups, such as oxalic acid, malonic acid, succinic acid, glutaric acid, adipic acid, pimelic acid, suberic acid, azelaic acid or sebacic acid.

As an especially preferred example of organic polymers (B), there can be mentioned an organic polymer having a low heat decomposition temperature and having a relatively good compatibility with the at least one silica precursor (A) and silica. The use of such an organic polymer is advantageous in that the phase separation between the silica precursor (A) and the organic polymer (B) is appropriately controlled, so that the porous silica thin film which is obtained by removing the organic polymer (B) from the silica/organic polymer composite thin film has a uniform pore diameter, thereby enhancing the surface smoothness and mechanical strength of the porous silica thin film.

As an example of such an organic polymer, there can be mentioned a block copolymer comprising two or more blocks each having recurring units comprising straight chain or cyclic oxyalkylene groups having 1 to 8 carbon atoms.

Specific examples of such polymers include binary block copolymers, such as a polyethylene glycol polypropylene glycol and a polyethylene glycol polybutylene glycol, and straight chain, ternary block copolymers, such as a polyethylene glycol polypropylene glycol polyethylene glycol, a polypropylene glycol polyethylene glycol polypropylene glycol and a polyethylene glycol polybutylene glycol polyethylene glycol.

Of these block copolymers, preferred are those which have a structure wherein the polymer chain of the polymer is linked to at least three hydroxyl groups possessed by a saccharide, such as glycerol, erythritol, erythrose, pentaerythritol, a pentitol, a pentose, a hexitol, a hexose, a heptose or the like, and/or at least three groups selected from the group consisting of a hydroxyl group and a carboxyl group, each of which is contained in a hydroxy acid. Specific examples of such polymers include a branched glycerol polyethylene glycol polypropylene glycol and an erythritol polyethylene glycol polypropylene glycol polyethylene glycol.

Specific examples of saccharides other than mentioned above include sorbitol, mannitol, xylitol, threitol, maltitol, arabitol, lactitol, adonitol, cellobiose, glucose, fructose, sucrose, lactose, mannose, galactose, erythrose, xylulose, allulose, ribose, sorbose, xylose, arabinose, isomaltose, dextrose and glucoheptose.

Specific examples of hydroxy acids include citric acid, malic acid, tartaric acid, gluconic acid, glucuronic acid, glucoheptonic acid, glucooctanic acid, threonine acid, saccharic acid, galactonic acid, galactaric acid, galacturonic acid, glyceric acid and hydroxysuccinic acid.

It is further noted that, as the organic polymer (B), there can also be used an aliphatic higher alcohol/alkylene oxide copolymer which is obtained by addition polymerizing an alkylene oxide to an aliphatic higher alcohol. Specific examples of such polymers include a polyoxyethylene lauryl ether, a polyoxypropylene lauryl ether, a polyoxyethylene oleyl ether, a polyoxypropylene oleyl ether, a polyoxyethylene cetyl ether, a polyoxypropylene cetyl ether, a polyoxyethylene stearyl ether and a polyoxypropylene stearyl ether.

In the coating composition of the present invention, even when a volatile monomer having a boiling point of from 60 to 450° C. is used instead of the organic polymer (B), a composition having such excellent properties as possessed by the composition of the present invention can be obtained. When the boiling point of the volatile monomer is lower than 60° C., disadvantages are likely to be caused wherein, when the volatile monomer is removed by volatilization from the silica/volatile monomer composite thin film to produce a porous silica thin film, the density of the thin film greatly increases, so that it is impossible to obtain a porous silica thin film having a satisfactorily low relative dielectric constant. On the other hand, the boiling point of the monomer is higher than 450° C., a part of the volatile monomer remains in the porous silica thin film, so that the film properties of the porous silica thin film are disadvantageously lowered. (It should be noted that the below-mentioned temperature Ta, which is defined for an organic polymer, can also be defined for the volatile monomer.)

Volatile monomers can be used individually or in combination. Volatile monomers can also be used in combination with the organic polymers (B).

Examples of volatile monomers include organic compounds, such as a hydrocarbon, an alcohol, an ether, a ketone, a carboxylic acid, an ester, a carbonate, an acid anhydride, an amine, an imine, an imide, an amide, a urea, a urethane, a nitro compound, a cyano compound, a halide, silane, a siloxane, a phosphine, a phosphine oxide, a sulfide, a sulfoxide, a sulfone, a sulfonic acid and a germane. Of these volatile monomers, triacetin, tibutyrin and the like are preferred.

With respect to the number average molecular weight of the organic polymer (B), there is no particular limitation; however, the number average molecular weight of the organic polymer (B) is generally from 200 to 1,000,000, preferably from 200 to 300,000, more preferably from 200 to 50,000.

When the number average molecular weight of the organic polymer (B) is smaller than 200, the organic polymer (B) is removed too fast from the silica/organic polymer composite thin film, so that it is likely that a porous silica thin film having a desired porosity cannot be obtained. On the other hand, the number average molecular weight of the organic polymer (B) is larger than 1,000,000, the organic polymer (B) is removed too slowly from the silica/organic polymer composite thin film, so that it is likely that the organic polymer (B) remains in the porous silica thin film. When the number average molecular weight of the organic polymer (B) is from 200 to 50,000, a porous silica thin film having a desired high porosity can be very easily obtained in a short period of time. In this connection, it is noted that the pore size of the porous silica thin film becomes very small and uniform without depending heavily on the number average molecular weight of the organic polymer (B).

In the coating composition of the present invention, the amount of the organic polymer (B) is generally from 0.01 to 10 parts by weight, preferably from 0.05 to 5 parts by weight, more preferably from 0.5 to 3 parts by weight, relative to 1 part by weight of a product obtained by gelation of the whole amount of the silica precursor (A). (Hereinafter, the weight ratio of the organic polymer (B) to the product obtained by gelation of the whole amount of the silica precursor (A) is frequently referred to simply as "polymer ratio").

When the polymer ratio is smaller than 0.01, the silica obtained is unlikely to become porous. On the other hand, when the polymer ratio is larger than 10, a porous silica thin film having a satisfactorily high mechanical strength cannot always be obtained.

With respect to the water (C) and the at least one alcohol (D), an explanation is made below.

In the coating composition of the present invention, it is required that the weight ratio (WR) of the water (C) to the at least one silica precursor (A) satisfy the formula $0.01 < WR < 10$. When the weight ratio (WR) is 0.01 or less, the spreadability of the silica/organic polymer composite thin film on a substrate becomes lower. On the other hand, when the weight ratio (WR) is 10 or more, the silica precursor (A) tends to be deposited from the liquid coating composition, so that the coating composition becomes non-uniform.

It is preferred that the weight ratio (WR) satisfies the formula $0.1 < WR < 10$. It is more preferred that the weight ratio (WR) satisfies the formula $0.1 < WR < 5$.

In the coating composition of the present invention, it is required that the weight of the water (C) be larger than that of the at least one alcohol (D). Otherwise, the surface smoothness of the porous silica thin film becomes extremely poor. Specifically, when the weight of the water (C) is equal to or smaller than that of the alcohol (D), the value of the surface roughness of the thin film as measured by means of a roughness measuring device sometimes reaches a level as high as 300 Å or more, so that the roughness of the thin film can be recognized even by visual observation.

The reason why the weight of the water (C) must be larger than that of the alcohol (D) is presumed as follows. When the weight of the water (C) is equal to or smaller than that of the alcohol (D), immediately upon coating of the coating composition on a substrate so as to form a thin film of the coating composition, the alcohol (D) is easily condensed on the surface of the thin film, so that a micro phase separation structure containing an alcohol-rich phase is formed on the thin film and the alcohol-rich phase is selectively volatilized. As a result, the surface smoothness of the thin film becomes poor. However, when the weight of the water (C) is larger than that of the alcohol (D), such undesirable phenomenon does not occur and, hence, the surface smoothness of the thin film becomes good.

It is preferred that the weight ratio of the water (C) to the alcohol (D) is not larger than 5.

Specific examples of alcohols (D) include monohydric alcohols, such as methanol, ethanol, propanol, butanol, pentanol, hexanol and benzyl alcohol, and polyhydric alcohols, such as ethylene glycol, propylene glycol and glycerol.

With respect to the organic solvent (E), an explanation is made below. When the organic polymer (B) is soluble in a mixture of the water (C) and the alcohol (D), the coating composition of the present invention need not comprise the organic solvent (E). As examples of organic polymers (B) which are soluble in a mixture of the water (C) and the alcohol (D), there can be mentioned the above-mentioned organic polymers mainly comprising a member selected from the group consisting of an aliphatic polyether, an aliphatic polyester, an aliphatic polycarbonate and an aliphatic polyanhydride, each having a low heat decomposition temperature.

On the other hand, when the organic polymer (B) is insoluble in a mixture of the water (C) and the alcohol (D), it is required that the coating composition comprise the organic solvent (E).

Examples of organic solvents (E) include the above-mentioned alcohols; esters, such as ethyl formate, methyl acetate, ethyl acetate, ethyl lactate, ethylene glycol monomethyl ether acetate, ethylene glycol diacetate, propylene glycol monomethyl ether acetate, diethyl carbonate, ethylene carbonate and propylene carbonate; amides, such as formamide, N-methylformamide, N-ethylformamide, N,N-dimethylformamide, N,N-diethylformamide, N-methylacetamide, N-ethylacetamide, N,N-dimethylacetamide, N,N-diethylacetamide, N-methylpyrrolidone, N-formylmorpholine, N-acetylmorpholine, N-formylpiperidine, N-acetylpiperidine, N-formylpyrrolidine, N-acetylpyrrolidine, N-N'-diformylpiperadine and N-N'-diacetylpiperadine; lactones, such as γ-butyrolactone; and ureas, such as tetramethylurea and N-N'-dimethylimidazolidinone. These organic solvents can be used individually or in combination.

It is preferred that the coating composition of the present invention contains a substance which is capable of functioning as a catalyst for promoting the hydrolysis and dehydration-condensation reaction of the silica precursor (A). Examples of such substances which are capable of functioning as the catalyst include acids, such as hydrochloric acid, nitric acid, sulfuric acid, phosphoric acid, formic acid, acetic acid, oxalic acid, malonic acid, maleic acid and toluenesulfonic acid; and bases, such as aqueous ammonia, potassium hydroxide, sodium hydroxide, triethylamine, triethanolamine, pyridine, piperidine and choline. These acids and bases can be used individually or in combination. Further, these acids can be used in combination with these bases.

Of these acid catalysts, phosphoric acid is especially preferred. The use of phosphoric acid as a catalyst is advantageous not only in that the storage stability of the coating composition is improved, but also in that phosphoric acid reacts with the silica precursor (A) to promote the formation of an Si—O—P— linkage.

The formation of at least one Si—O—P— linkage in the silica precursor (A) is advantageous in that the surface smoothness and mechanical strength of the porous silica thin film obtained are improved. The reason for the improvement in the mechanical strength of the porous silica thin film is presumed as follows. By virtue of a phosphorus atom, which can form more covalent linkages than a silicon atom, the crosslinking density of a network of a silicon oxide is enhanced, so that the total skeleton structure of the thin film is strengthened.

As explained below, when the porous silica thin film of the present invention contains phosphorus atoms, such a porous silica thin film can be very advantageously used as an insulating thin film for a multi-level interconnect for a semiconductor device.

Conventionally, in a production process for a semiconductor device, a fluorine plasma is used for treating an insulating thin film layer. When the insulating thin film layer contains an atom which is capable of producing a chemical species having no volatility by the plasma treatment, such a chemical species having no volatility will remain as a process residue in the semiconductor device produced, leading to a contamination of a material in the semiconductor device and a marked lowering of the precision of the process. For this reason, a conventional insulating layer is generally comprised of silicon atoms, oxygen atoms and hydrogen atoms, but does not contain phosphorus atoms. However, it has been found that even when the insulating layer contains phosphorus atoms, the phosphorus atoms are easily removed as a gaseous compound containing a phosphorus atom by the plasma treatment, so that the phosphorus atoms will not remain in the semiconductor device. Therefore, even when the porous silica thin film obtained by the method of the present invention contains phosphorus atoms, any problems do not occur in the treating process.

If desired, an additive can be incorporated into the coating composition of the present invention in such an amount as will not impair the effects of the present invention. Examples of additives include a photocatalyst generator for imparting a photosensitivity, an agent for improving the adhesion to a substrate, and a stabilizer for a long-term storage.

Hereinbelow, an explanation is made with respect to the method for producing the coating composition of the present invention, but the explanation should not be construed as limiting the scope of the present invention.

Water is required for the hydrolysis of the alkoxysilane used in the present invention. Water is generally added to the alkoxysilane in a form as such or in the form of a solution thereof in an alcohol; however, water may be added in the form of steam. When the addition of water to the alkoxysilane is conducted rapidly, it is possible that, depending on the type of alkoxysilane, a hydrolysis and a condensation proceed too fast, so that a condensation product is likely to be precipitated. For preventing the precipitation of a condensation product, various techniques are employed. Examples of such techniques include a technique in which the addition of water is conducted over a considerable period of time; a technique in which a solvent, such as an alcohol, is used in combination with water; and a technique in which the addition of water is conducted at low temperatures. These techniques can be employed individually or in combination.

An acid is used as a catalyst for hydrolyzing the alkoxysilane. The acid may be used in the form of a gas, a liquid or a solid; however, from the viewpoint of ease in handling, it is preferred that the acid is used in the form of liquid or solid. Preferred examples of solid acids include cation exchange resins, such as a cation exchange resin having a sulfonic acid group as a cation exchange group and a cation exchange resin having a carbonic acid group as a cation exchange group.

As a catalyst for hydrolyzing the alkoxysolane, a base can also be used. Further, the alkoxysilane can be stepwise treated using an acid and a base. Herein, the term "stepwise treated" means either a mode in which the coating composition is treated first with an acid and then with a base, or a mode in which the coating composition is treated first with a base and then with an acid.

The amount of the catalyst is 1 mol or less, preferably $10^{-1}$ mol or less, per mole of the alkoxysilane. When the amount of the catalyst is more than 1 mol, the catalyst tends to form a deposit, thereby rendering it difficult to obtain a homogeneous porous silica thin film.

The manner of supplying the catalyst is not specifically limited but can be made in any desired manner. For example, the catalyst may be added to the alkoxysilane in advance. Alternatively, the catalyst may be dissolved or dispersed in the water which is added to the alkoxysilane.

It is not required that all alkoxy groups in a molecule of the alkoxysilane be hydrolyzed. For example, only one alkoxy group in a molecule of the alkoxysilane may be hydrolyzed. Alternatively, two or more alkoxy groups in a molecule of the alkoxysilane may be hydrolyzed. Further, the hydrolysis product may contain both a molecule having only one alkoxy group hydrolyzed and a molecule having two or more alkoxy groups hydrolyzed. In the present invention, the term "dehydration-condensation" (hereinafter, frequently referred to simply as "condensation") means that a silanol group in a molecule of the hydrolysis product undergo dehydration-condensation to form an Si—O—Si linkage. It is not required that, by the dehydration-condensation, all silanol groups in a molecule of the hydrolysis product form Si—O—Si linkages. Only a part of silanol groups in a molecule of the hydrolysis product may form Si—O—Si linkages. The hydrolysis products may have different degrees of condensation, which may be present in a mixture thereof.

In the present invention, all or a part of the alkoxysilane are hydrolyzed, and a part of the hydrolysis product undergo dehydration-condensation. The coating composition of the present invention undergoes a temperature history generally in the range of from 0 to 180° C., preferably from 30 to 150° C., more preferably from 30 to 80° C.

The alkoxysilane is hydrolyzed to form a silanol. Then, the silanol groups undergo condensation therebetween, thereby forming a silica precursor (in the form of an oligomer) having a siloxane linkage.

When the alkoxysilane is hydrolyzed, an alcohol is by-produced. Further, water is by-produced in the subsequent condensation reaction.

An alcohol other than the alcohol by-produced by the hydrolysis reaction may be added.

With respect to the addition of an organic polymer, an explanation is made below. An organic polymer may be added immediately after the hydrolysis of the alkoxysilane. However, from the following two viewpoints, it is preferred that an organic polymer is added after the alkoxysilane has grown into a silica precursor oligomer:

(1) the viscosity of the coating composition is appropriately increased, so that the morphology of the thin film produced from the coating composition can be retained and, hence, the thin film has a uniform thickness; and (2) when the silica precursor is subjected to gelation, a silica skeleton is formed in a mild fashion, so that the shrinkage of the thin film is unlikely to occur.

As mentioned above, an alcohol other than the alcohol by-produced by the hydrolysis reaction may be added.

By the above-mentioned method, a mixture comprising a silica precursor, an organic polymer, water and an alcohol is formed. For adjusting the amounts of water and the alcohol in the mixture, parts of the water and alcohol are removed from the mixture. As examples of methods for removing the water and alcohol from the mixture, there can be mentioned the following three methods:

(1) a method comprising directly distilling off parts of the water and alcohol;

(2) a method comprising extracting parts of the water and alcohol using a solvent which is a poor solvent for the silica precursor and the organic polymer and which is, however, a good solvent for water and the alcohol, or using a solvent which is a good solvent for the silica precursor and the organic polymer and which is, however, a poor solvent for water and the alcohol; and (3) a thin film distillation method.

From the viewpoint of simplicity and ease in adjusting the amounts of the water and alcohol, among the above-mentioned removal methods, the distillation meth-method of item (1) above and the thin film distillation method of item (3) above are preferred. When the distillation method or the thin film distillation method is employed, the distilling off of water and the alcohol can be conducted either under atmospheric pressure or under reduced pressure. However, when the distilling off of water and the alcohol is conducted under atmospheric pressure, the distillation temperature is generally high, leading to a danger such that solidification of the silica precursor occurs during the distilling off of water and the alcohol. Therefore, it is preferred that water and the alcohol are distilled off under reduced pressure. The distillation temperature is preferably from 0 to 100° C., more preferably from 20 to 80° C.

By adjusting the amounts of water and an alcohol in the above-mentioned mixture comprising a silica precursor, an organic polymer, water and an alcohol, the coating composition of the present invention can be obtained.

In the above-mentioned method, the organic polymer may be added after adjusting the amounts of water and the alcohol. That is, the organic polymer may be added to a mixture which comprises a silica precursor, water and an alcohol and does not have an organic polymer incorporated thereinto. For adjusting the amount of the alcohol, an alcohol other than the alcohol by-produced by the hydrolysis reaction may be added. Similarly, for adjusting the amount of water, water other than the water by-produced by the condensation reaction may be added.

By using the coating composition of the present invention, the silica/organic polymer composite thin film of the present invention can be produced. Further, by removing the organic polymer from the silica/organic polymer composite thin film, the porous silica thin film of the present invention can be produced. Hereinbelow, an explanation is made with respect to the method for producing the silica/organic polymer composite thin film and to the method for producing the porous silica thin film, but the explanation should not be construed as limiting the scope of the present invention. The silica/organic polymer composite thin film can be produced by a method comprising the following steps (1) and (2), and the porous silica thin film can be produced by a method comprising the following steps (1) to (3):

(1) a step in which the coating composition of the present invention is coated on a substrate to form a thin film of the composition on the substrate;

(2) a step in which the silica precursor contained in the thin film is subjected to gelation to thereby obtain a silica/organic polymer composite thin film; and (3) a step in which the organic polymer is removed from the silica/organic polymer composite thin film to obtain a porous silica thin film.

First, an explanation is made with respect to the above-mentioned step (1).

The formation of a thin film can be performed by coating the coating composition of the present invention on a substrate. As a method for forming a thin film, any conventional method, such as casting, immersing or spin coating, can be employed. However, the spin coating method is preferred when it is intended to use the thin film for an insulating layer for a multilevel interconnect for a semiconductor device. The thickness of the thin film can be controlled within the range of from 0.1 $\mu$m to 100 $\mu$m by varying the viscosity of the coating composition and the revolution rate of the spin coater. When the thickness of the thin film is larger than 100 μm, the thin film tends to suffer cracking. When it is intended to use the thin film for an insulating layer for a multilevel interconnect for a semiconductor device, the thickness of the thin film is generally from 0.1 μm to 5 μm.

Examples of substrates include substrates comprised of a single element substance semiconductor, such as silicon or germanium, and substrates comprised of a compound semiconductor, such as gallium-arsenic or indium-antimony. These semiconductor substrates may be used in a form having formed thereon a thin film of a substance other than the substance used as a material for the substrate. Examples of substances for such a thin film formed on a semiconductor substrate include metals, such as aluminum, titanium, chromium, nickel, copper, silver, tantalum, tungsten, osmium, platinum and gold; inorganic compounds, such as silicon dioxide, fluorinated glass, phosphate glass, borate-phosphate glass, borosilicate glass, polycrystalline silicon, alumina, titania, zirconia, silicon nitride, titanium nitride, tantalum nitride, boron nitride, hydrogen silsesquioxane; and organic polymers, such as methyl silsesquioxane, amorphous carbon, fluorinated amorphous carbon and a polyimide.

Prior to the formation of a thin film of the composition on a substrate, the surface of the substrate may be treated with an agent for improving the adhesion to the thin film. As examples of agents for improving the adhesion to the thin film, there can be mentioned substances used as a so-called silane coupling agent, or chelate compounds of aluminum. Especially preferred examples of agents for improving the adhesion include 3-aminopropyltrimethoxysilane, 3-aminopropyltriethoxysilane, N-(2-aminoethyl)-3-aminopropyltrimethoxysilane, N-(2-aminoethyl)-3-aminopropylmethyldimethoxysilane, vinyltrichlorosilane, vinyltriethoxysilane, 3-chloropropyltrimethoxysilane, 3-chloropropylmethyldichlorosilane, 3-chloropropylmethyldimethoxysilane, 3-chloropropylmethyldiethoxysilane, 3-mercaptopropyltrimethoxysilane, 3-glycidoxypropyltrimethoxysilane, 3-glycidoxypropylmethyldimethoxysilane, 3-methacryloxypropyltrimethoxysilane, 3-methacryloxypropylmethyldimethoxysilane, hexamethyldisilazane, (ethyl acetoacetato)aluminum diisopropylate, tris(ethyl acetoacetato)aluminum, bis(ethyl acetoacetato)aluminum monoacetylacetonate, and tris (acetylacetonato)aluminum. If desired, when the agent for improving the adhesion to the thin film is applied onto a substrate, other additives may be added to the agent, and the agent may be diluted with a solvent. The treatment of the surface of the substrate with the agent for improving the adhesion to the thin film is conducted by a conventional method.

With respect to the above-mentioned step (2), an explanation is made below.

It is preferred that the gelation of the silica precursor is effected by heating in an atmosphere of inert gas having an oxygen concentration $[O_2]$ of not higher than 5% by volume.

The oxygen concentration $[O_2]$ is measured at an exhaust port for the inert gas during the heating thereof. As examples of inert gases used, there can be mentioned nitrogen, argon and helium gases. These inert gases can be used individually or in combination. A small amount of steam may be contained in the inert gas. When the oxygen concentration $[O_2]$ is higher than 5% by volume, the relative dielectric constant of the porous silica thin film is not satisfactorily lowered and the abrasion resistance of the thin film is not satisfactory. The oxygen concentration $[O_2]$ is more preferably from 1 ppm by volume to 1% by volume, still more preferably from 10 ppm by volume to 1% by volume. It is possible to obtain a desired porous silica thin film even under conditions wherein the oxygen concentration $[O_2]$ is less than 1 ppm by volume. However, it is very difficult to achieve an oxygen concentration of less than 1 ppm by volume and, hence, unpractical.

The temperature at which gelation of the silica precursor is effected is referred to as "temperature $T_1$". The temperature $T_1$ is generally from 0 to 300° C., preferably from 60 to 300° C. When the temperature $T_1$ is lower than 0° C., the reaction rate becomes small, so that the period of time required for a satisfactory gelation of the alkoxysilane becomes disadvantageously long. On the other hand, when the temperature $T_1$ is higher than 300° C., formation of large voids tends to occur, so that the homogeneity of the silica/organic polymer composite thin film is lowered.

Further, it is preferred that the temperature $T_1$ satisfies the formula 60° C.$\leq T_1 \leq T_a$, wherein $T_a$ represents the temperature at which a 1% by weight decrease in weight of the organic polymer is reached when the organic polymer is heated at a temperature elevation rate of 10° C./min in an atmosphere of inert gas. The inert gas fed for measuring the temperature $T_a$ may or may not be the same gas as fed for effecting gelation of the alkoxysilane. The temperature $T_a$ is measured by TGA (thermogravimetric analysis). The temperature $T_a$ varies depending on the type of the organic polymer. Any organic polymer has a temperature $T_a$ of 60° C. or more.

When a plurality of types of organic polymers are used, the temperature $T_a$ means the lowest of the temperatures $T_a$'s of the plurality of types of organic polymers.

When $T_1 \leq T_a$, it is advantageous not only in that gelation of the alkoxysilane easily occurs, but also in that the organic polymer is substantially not removed in the gelation process, so that a silica/organic polymer composite thin film having retained the silica precursor/organic polymer ratio can be obtained. As a result, when the organic polymer is removed in the subsequent step (3), a porous silica thin film having a desired porosity can be obtained.

On the other hand, when $T_a < T_1$, the organic polymer is removed prior to gelation of the alkoxysilane, so that an undesired shrinkage of the silica precursor occurs. As a result, the porous silica thin film obtained in the step (3) tends to have a low porosity and, hence, has a high dielectric constant.

When the temperature $T_1$ is lower than 60° C., gelation of the silica precursor does not proceed satisfactorily, so that it is unlikely that the porous silica thin film obtained in the subsequent step (3) has a desired value of relative dielectric constant.

The time for gelation of the alkoxysilane varies depending on the temperature of the heat treatment, the amount of the catalyst, and the type and amount of the solvent. However, generally, the time for gelation of the alkoxysilane is in the range of from several minutes to several days.

In the present invention, the term "gelation of the silica precursor" means that the silica precursor is subjected to a hydrolysis and dehydration-condensation reaction to obtain a silica precursor having a condensation ratio of 80% or more. When the gelation of the silica precursor contained in the thin film of the coating composition of the present invention is conducted by the method of the present invention, substantially all of the water and the alcohol contained in the thin film are removed.

The condensation ratio of the product obtained by gelation of the silica precursor contained in the thin film can be determined by means of a solid Si-NMR measurement apparatus in accordance with a combination of a high power decoupling method with an MAS method. In this method, a powder sample of the thin film is introduced into, for example, MSL400 (manufactured and sold by Brucker, U.S.A) to conduct an Si-NMR measurement under the following conditions, and the condensation ratio of the sample is calculated by the below-mentioned formula:

pulse width (45 pulse): 5.5 ($\mu$sec);
repeat time: 60 (sec);
number of integration: 1,000 times; and
revolution rate of the sample: 5,000 (Hz).

An explanation is made with respect to the calculation method of the condensation ratio of the product obtained by gelation of the silica precursor, taking as an example a case where tetraethoxysilane (TEOS) is used as an alkoxysilane. The condensation ratio is calculated by the following formula (see S. Leonardelli, et al., J. Am. Chem. Soc., 1992, 114, pp. 6412–6418):

$$\text{Condensation ratio } (\%) = 100 \times (Q_1 + 2Q_2 + 3Q_3 + 4Q_4) / \{4(Q_0 + Q_1 + Q_2 + Q_3 + Q_4)\} \quad (4)$$

wherein $Q_0$ represents the integral strength of the signals ascribed to TEOS used as a raw material and/or signals ascribed too a compound obtained by hydrolysis of at least one ethoxy group contained in TEOS, $Q_1$ represents the integral strength of the signals ascribed to a group formed by linking a silicon atom to another silicon atom through an oxygen atom, $Q_2$ represents the integral strength of the signals ascribed to a group formed by linking a silicon atom to two other silicon atoms each through an oxygen atom, $Q_3$ represents the integral strength of the signals ascribed to a group formed by linking a silicon atom to three other silicon atoms each through an oxygen atom and $Q_4$ represents the integral strength of the signals ascribed to a group formed by linking a silicon atom to four other silicon atoms each through an oxygen atom, and wherein each of the integral strength $Q_0$, $Q_1$, $Q_2$, $Q_3$ and $Q_4$ is measured by means of the above-mentioned apparatus.

In the step (2), it is preferred that, prior to gelation of the alkoxysilane, the coating composition is preheated to remove the water and alcohol contained in the coating composition, and optionally an organic solvent (which, as mentioned above, is optionally contained in the coating composition). By this preheating, the morphology retention of the silica/organic polymer composite thin film is improved and, hence, the surface smoothness of the silica/organic polymer composite thin film is improved.

In general, the removal of the water, the alcohol, and optionally the solvent is generally conducted by heating in an atmosphere of air or inert gas at a temperature of from 30 to 200° C. for a period of time of from 10 seconds to 10 minutes. It is preferred that the removal is conducted at a temperature of from 50 to 200° C. for a period of time of from 10 seconds to 10 minutes.

The silica/organic polymer composite thin film obtained in the step (2) not only has an improved mechanical strength and a low dielectric constant, but also exhibits an excellent surface smoothness, and can be formed so as to have a large thickness. Therefore, the silica/organic polymer thin film as such can be used as an insulating portion of a circuit. Further, the silica/organic polymer thin film can also be put to other uses. For example, the silica/organic polymer thin film can be used as an optical film, a structural material, a film and a coating material. However, from the viewpoint of obtaining a further lower dielectric constant material which can be used as an insulating thin film for a multilayer interconnect for an LSI, it is preferred to convert the silica/organic composite thin film obtained in the step (2) to a porous silica thin film by the subsequent step (3).

With respect to the above-mentioned step (3), an explanation is made below.

In the step (3), a porous silica thin film is obtained by removing the organic polymer from the organic/silica polymer composite thin film obtained in the step (2). In the step (2), if the gelation of the silica precursor has satisfactorily proceeded, when the organic polymer is removed from the silica/organic polymer composite thin film, the spaces in the silica/organic polymer composite thin film, which had been occupied by the organic polymer, are not collapsed but left as pores in the porous silica thin film. As a result, a porous silica thin film having a high void ratio and hence a low dielectric constant can be obtained.

Examples of methods for removing the organic polymer from the silica/organic polymer composite thin film include heating, plasma treatment and solvent extraction. Of these methods, heating is most preferred, since heating can be easily performed in the current process for producing a semiconductor device. When the organic polymer is removed by heating, the heating temperature varies depending on the type of the organic polymer used. Some organic polymers are removed simply by evaporation/dissipation which is not accompanied by degradation of the organic polymers. Other organic polymers are removed by calcination accompanied by degradation of the organic polymers. Further, there is a case where the organic polymer is removed by a combination of evaporation/dissipation with calcination.

The temperature for heating the silica/organic polymer composite thin film (hereinafter, frequently referred to as "temperature $T_2$") is generally from 300 to 450° C., preferably from 350 to 400° C. When the temperature $T_2$ is lower than 300° C., there is a danger such that the organic polymer is not satisfactorily removed, so that some organic substances derived from the organic polymer may remain as impurities in the resultant porous silica thin film and, hence, it becomes difficult to obtain a porous silica thin film having a low dielectric constant. On the other hand, when the temperature $T_2$ is higher than 450° C., such a high temperature is preferred from. the viewpoint of removing the organic polymer, but it is difficult to incorporate this heating method into the current process for producing a semiconductor device.

It is preferred that the temperature $T_2$ satisfies the formula $T_a \leq T_2 \leq 450°$ C. When the temperature $T_2$ is lower than temperature $T_a$, some substances may sometimes remain as impurities in the resultant porous silica thin film, leading to a difficulty in obtaining a porous silica thin film having a low dielectric constant and a high abrasion resistance. On the other hand, when the temperature $T_2$ is higher than 450° C., the organic polymer is satisfactorily removed, but disadvantages are likely to be caused wherein when the resultant porous silica thin film is used for a semiconductor device, the semiconductor device is damaged.

In the present invention, the temperature $T_a$ is 450° C. or less. With respect to most of conventional organic polymers, the temperature $T_a$ is 450° C. or less.

It is preferred that the heating is conducted for a period of from 10 seconds to 24 hours. When the heating time is shorter than 10 seconds, the organic polymer is not satisfactorily evaporation-dissipated or thermally decomposed, so that some organic substances derived from the organic polymer may remain as impurities in the resultant porous silica thin film and, hence, the dielectric constant of the porous silica thin film is not lowered. In general, thermal decomposition or evaporation/dissipation of the organic polymer is completed within 24 hours. Therefore, a longtime heating for more than 24 hours is useless.

It is preferred that the heating is conducted in an atmosphere of inert gas having an oxygen concentration [$O_2$] of not higher than 5% by volume. As examples of inert gases, there can be mentioned nitrogen, argon and helium gases. The inert gas fed for heating the silica/organic polymer composite thin film may or may not be the same gas as fed for gelation of the alkoxysilane used in the step (2). Further, the inert gas fed for heating the silica/organic polymer composite thin film may or may not be the same gas as fed for measuring the temperature $T_a$.

The heating of the organic/silica polymer composite thin film can also be conducted in an oxidizing atmosphere containing air or oxygen gas. In this case, it is preferred that the oxidizing gas concentration is controlled within a range wherein the organic polymer is substantially not decomposed prior to gelation of the silica precursor. Alternatively, the heating can be conducted in an atmosphere of a gas containing ammonia, hydrogen or the like. In this case, a silanol group remaining in the silica can be deactivated, thereby making it possible to lower the hygroscopicity of the porous silica thin film and suppress the increase in the dielectric constant of the porous silica thin film.

The heating of the organic/silica polymer composite thin film can be conducted by means of a conventional apparatus used in the current semiconductor device production process, such as a vertical furnace or a hot plate type calcination system.

In general, gelation of the silica precursor proceeds also in the step (3). The condensation ratios of the gelation products at the points in time of completion of the steps (2) and (3) are about 85% and about 90%, respectively.

Surface treatment of the obtained porous silica thin film with a silylating agent is effective for lowering the hygroscopicity of the porous silica thin film, stabilizing the dielectric constant and improving the adhesion of the porous silica thin film to other substances. Examples of silylating agents include alkoxysilanes, such as trimethylmethoxysilane, trimethylethoxysilane, dimethyldimethoxysilane, dimethyldiethoxysilane, methyltrimethoxysilane, methyltriethoxysilane, dimethylethoxysilane, methyldiethoxysilane, dimethylvinylmethoxysilane, dimethylvinylethoxysilane, diphenyldimethoxysilane, diphenyldiethoxysilane, phenyltrimethoxysilane and phenyltriethoxysilane; chlorosilanes, such as trimethylchlorosilane, dimethyldichlorosilane, methyltrichlorosilane, methyldichlorosilane, dimethylchlorosilane, dimethylvinylchlorosilane, methylvinyldichlorosilane, methylchlorodisilane, triphenylchlorosilane, methyldiphenylchlorosilane and diphenyldichlorosilane; and silazanes, such as hexamethyldisilazane, N,N'-bis(trimethylsilyl)urea, N-(trimethylsilyl)acetamide, dimethyl(trimethylsilyl)amine, diethyl(triethylsilyl)amine and trimethylsilylimidazole. Examples of methods for the silylation include application of the silylating agent by coating, immersing in the silylating agent or a solution thereof, and exposure to the vapor of the silylating agent.

The silica precursor/organic polymer composite thin film and porous silica thin film, each of which is obtained by the above-mentioned method, can be used for producing a multilevel interconnect. It is possible to produce a multilevel interconnect comprising a plurality of insulating layers and circuits formed on the insulating layers, wherein at least one layer of the insulating layers comprises the above-mentioned thin film. Further, it is also possible to produce a semiconductor device comprising the multilevel interconnect.

Hereinbelow, an explanation is made with respect to the methods for producing the multilevel interconnect and semiconductor device, but the explanation should not be construed as limiting the scope of the present invention.

First, a semiconductor device including gate electrodes separated through a semiconductor separating region is formed on a silicon semiconductor substrate. Then, on the whole surface of the silicon semiconductor substrate having formed thereon semiconductor device is formed a silicon oxide film having a thickness, for example, of 500 nm by the CVD method (Chemical Vapor Deposition method) using, for example, $SiH_4$—$O_2$. A circuit material is deposited on the silicon oxide film on the silicon semiconductor substrate. As examples of circuit materials, there can be mentioned electroconductive materials, such as aluminum, alloys of aluminum (e.g., an Al—Si alloy), copper, alloys of copper, tungsten, alloys of tungsten (e.g., a W—Si alloy), titanium, and a titanium compound. Examples of methods for depositing a metal circuit material on the silicon oxide film include a sputtering method, a deposition method and a CVD method.

A resist film is formed on the whole surface of the circuit material, followed by patterning to thereby obtain a circuit layer. As examples of patterning methods, there can be mentioned conventional methods, such as a resist process and an etching process.

Then, the coating composition of the present invention is coated on the circuit layer, followed by drying, calcination and annealing to thereby form an insulating layer (of the porous silica thin film of the present invention) having a low dielectric constant and having a thickness, for example, of 500 nm. Specifically, when the coating is conducted by spin coating, a conventional coating apparatus, such as a spin coater is used. The spin coating is conducted at a revolution rate of 500 rpm for 10 seconds and then at a revolution rate of 3,000 rpm for 60 seconds. The calcination is conducted by means of a plate heater at 150° C. for 5 minutes and then at 250° C. for 30 minutes. The annealing is conducted at 400° C. for 30 minutes in a nitrogen atmosphere. The annealing can be conducted, for example, by means of a commercially available diffusion furnace. Thus, an insulating layer of the porous silica thin film of the present invention is formed on the circuit layer.

Then, a silicon oxide film (as an intermediate layer) having a thickness of 10 nm is formed on the obtained porous silica thin film layer. The silicon oxide film intermediate layer is formed by means of a commercially available CVD apparatus using, for example, weakly oxidative $SiH_4$—$N_2O$ gas under conditions wherein the temperature is 350° C. and the pressure is 1 kPa. The intermediate layer is prepared for the purpose of using the intermediate layer as an etching mask used in the formation of via holes through which the circuit layer over the intermediate layer and the circuit layer under the intermediate layer are connected.

Further, a thick silicon oxide film is formed on the above-mentioned oxide silicon film by a plasma CVD method, thereby producing the semiconductor device of the present invention. The formation of the thick silicon oxide film is conducted by means of a commercially available sheeter type plasma CVD apparatus using TEOS (tetraethoxysilane)—$O_2$ gas.

In the thus produced semiconductor device, a material having a heat resistance and a low dielectric constant is used as an insulating layer between circuit layers, so that the electrostatic capacity between the circuit layers is remarkably lowered. Therefore, the semiconductor device has high reliability.

The porous silica thin film of the present invention can also be used as a porous silica in the form of a bulk. For example, the porous silica in the form of a bulk can be used as an optical film, a catalyst carrier, a heat insulation material, an absorbent, a column filler, a caking inhibitor, a thickening agent, a pigment, an opaquer, a ceramic, an anti-flaming agent, an abrasive agent and a dentifrice.

BEST MODE FOR CARRYING OUT THE INVENTION

Hereinbelow, the present invention will be described in more detail with reference to the following Examples and Comparative Examples, but they should not be construed as limiting the scope of the present invention.

In the following Examples and Comparative Examples, various properties were measured and evaluated as follows.
(1) Amounts of water and an alcohol contained in a coating composition, and weight ratio (WR) of the water to a silica precursor:

To 1 ml of a coating composition is added 0.2 g of dimethoxyethane as an internal standard, thereby obtaining a sample mixture. The sample mixture is analyzed using a gas chromatograph (GC) apparatus (gas chromatograph GC-7A, manufactured and sold by Shimadzu Corporation, Japan) to determine the amounts of water and ethanol contained in the coating composition. The conditions for the GC are as follows:
Column: Gaskuropack 56;
Temperature programming: initially, the temperature is maintained at 100° C. for 2 minutes, then the temperature is elevated at a rate of 10° C./min to 200° C., and then the temperature is maintained at 200° C. for 16 minutes; and
Detector: TCD (thermal conductivity detector).

The amounts of the water and ethanol contained in the coating composition are determined in terms of the peak area ratios of water and ethanol to the internal standard in a chromatogram obtained by the GC, by using calibration curves separately prepared.

The weight ratio (WR) of the water in the coating composition to a silica precursor in the coating composition is determined as follows. The weight of the silica precursor in the coating composition is given in terms of the weight of a silica obtained by conversion of the whole amount of the silica precursor (i.e., the alkoxysilane(s) charged). The "weight of a silica obtained by conversion of the whole amount of the silica precursor" can be obtained as follows. For example, when 1 mol of tetramethoxysilane is used as an alkoxysilane, 1 mol of tetramethoxysilane is converted to 1 mol of silica ($SiO_2$), which has a weight of 60.1 g. When a plurality of alkoxysilanes are used, the weight of the silica precursor is given in terms of the total weight of the silicas obtained by conversion of the alkoxysilanes in accordance with the molar fractions of the respective alkoxysilanes.

From the thus obtained weight of the silica precursor and the weight of water obtained above, the weight ratio (WR) of the water to the silica precursor is obtained.
(2) Surface smoothness of a thin film:

In the surface of a thin film formed on a circular silicon wafer are cutting a pair of grooves by cutting wherein the distance between the grooves is about 5 mm in a direction of the circumference of the circular silicon wafer. The surface of the thin film is scanned over the range of 7,000 μm in a direction perpendicular to the grooves by means of a surface roughness measuring apparatus (DEKTAK 3 Model; manufactured and sold by Sloan Technology Corporation, U.S.A.) while adjusting a horizontal level to the surface of the silicon wafer (the scanning time: 35 seconds). A range of 3,000 μm is chosen from the scanned range of 7,000 μm, and the surface roughness (Ra) of the thin film over the chosen range of 3,000 μm is calculated by the following formula:

$$Ra = \frac{1}{l} \int_0^l \left| t(x) - \bar{t} \right| dx \qquad (5)$$

wherein l represents the range (3,000 μm) over which the surface roughness (Ra) is determined, t(x) represents the height of the thin film at a point x on the silicon wafer, and $\bar{t}$ represents the average value of t(x) wherein x runs over the range (3,000 μm) over which the surface roughness (Ra) is determined.

The surface smoothness of the thin film is evaluated in terms of the surface roughness (Ra). Specifically, the smaller the Ra, the better the surface smoothness of the thin film.
(3) Relative dielectric constant of a thin film (k):

A thin film is formed on a silicone wafer having titanium nitride (TiN) on the surface thereof. The upper surface of the thin film is coated with aluminum by vacuum deposition through an SUS mask to thereby form an electrode having a diameter of 1.7 mm. Using the thus obtained electrode, the relative dielectric constant (k) of the thin film to the dielectric constant of air is measured at 1 MHz by means of a C meter/CV plotter (4280A Model; manufactured and sold by Hewlett Packard Ltd., U.S.A.).
(4) Weight decrease ratio of an organic polymer (measurement of the temperature Ta):

The measurement of the weight decrease ratio of an organic polymer is performed by means of a thermogravimetric analysis apparatus (TGA-50 Model; manufactured and sold by Shimadzu Corporation, Japan). As a sample, 20 mg of an organic polymer is fed to the thermogravimetric analysis apparatus. An inert gas having substantially the same composition as used in producing a silica/organic polymer composite thin film from a coating composition containing the organic polymer is fed to the thermogravimetric analysis apparatus at a rate of 40 ml/min. The organic polymer is heated at a temperature elevation rate of 10° C./min to thereby obtain a temperature/weight decrease curve. From the temperature/weight decrease curve, the temperature Ta at which the weight of the organic polymer decreases by 1% by weight is obtained.

The oxygen concentration of an inert gas fed for heating a thin film is measured by means of a zirconia type oxygen concentration measuring apparatus (LC-750; manufactured and sold by Toray Engineering Co., Ltd., Japan).

Hereinafter, a polyethylene glycol dimethyl ether having a number average molecular weight of 500 is referred to simply as "MM500", and a polyethylene glycol dimethyl ether having a number average molecular weight of 600 is referred to simply as "MM600".

The results obtained in the Examples and Comparative Examples are shown in Table below.

EXAMPLE 1

A mixture of 1,480 g of methyltriethoxysilane (MTES), 480 g of tetraethoxysilane (TEOS), 523 g of water and 120 ml of a water-wetted, sulfonic acid type cation exchange resin (containing 92 g of water) (trade name: AMBERLYST RCP-160M) (manufactured and sold by Mitsubishi Chemical Corporation, Japan) was subjected to a pretreatment of stirring at 50° C. for 8 hours, followed by recovering the cation exchange resin by filtration, thereby obtaining a solution comprising a silica precursor, water and ethanol. To 790 g of the obtained solution was added 267.0 g of an 80% by weight aqueous solution of MM500 as an organic polymer to obtain 1,057.0 g of a solution. The obtained solution was subjected to a reduced pressure treatment at 50° C. for 1 hour by means of a rotary evaporator to distill off 477.6 g of a mixture of water and ethanol, thereby obtaining 579.4 g of a solution. To the obtained solution were added 963 g of propylene glycol methyl ether acetate and 30 g of water, thereby obtaining 1,572.4 g of a coating composition. The coating composition contained 117.6 g of water and 46.7 g of ethanol. In the coating composition, the weight ratio (WR) of the water to the silica precursor was 0.6, and the weight ratio of the water to the ethanol was 2.5, which means that, in the coating composition, the weight of water was larger than that of ethanol. Further, the coating composition had a polymer ratio of 1.0, wherein, as defined above, the polymer ratio is the weight ratio of the polymer to a product obtained by gelation of the whole amount of the silica precursor.

3 ml of the coating composition was dropwise applied onto a silicon wafer having a diameter of 6 inches and spin-coated at 23° C. for 60 seconds at a revolution rate of 2,000 rpm to form a thin film of the coating composition on the silicon wafer. The thin film of the coating composition was preheated at 120° C. for 1 minute in air. The preheated thin film of the coating composition was calcined at 200° C. for 1 hour in a nitrogen gas atmosphere having an oxygen concentration [$O_2$] of 100 ppm by volume to thereby effect gelation of the silica precursor and obtain a silica/organic polymer composite thin film. The silica/organic polymer composite thin film was calcined at 400° C. for 1 hour in the same nitrogen atmosphere as mentioned above (i.e., a nitrogen gas atmosphere having [$O_2$] of 100 ppm by volume) to thereby obtain a porous silica thin film. The temperature Ta of MM500 was 250° C.

The obtained porous silica thin film had an excellent surface smoothness. Specifically, the porous silica thin film exhibited a surface roughness of 13 Å.

The porous silica thin film had a relative dielectric constant of 2.0, which was much smaller than that of $SiO_2$ (4.5).

EXAMPLE 2

A coating composition (1,573.1 g) was prepared in substantially the same manner as in Example 1, except that a polyethylene glycol monomethacrylate having a number average molecular weight of 500 was used as an organic polymer. The coating composition contained 122.4 g of water and 42.0 g of ethanol. In the coating composition, the weight ratio (WR) of the water to the silica precursor was 0.6, and the weight ratio of the water to the ethanol was 2.9, which means that, in the coating composition, the weight of water was larger than that of ethanol.

Using the coating composition, a porous silica thin film having a thickness of 1.09 μm was obtained in substantially the same manner as in Example 1, except that the silica/organic polymer composite thin film was calcined at 450° C.

The obtained porous silica thin film had an excellent surface smoothness. Specifically, the porous silica thin film exhibited a surface roughness of 20 Å. The porous silica thin film had a relative dielectric constant of 2.1.

EXAMPLE 3

A coating composition (2,022.9 g) was prepared in substantially the same manner as in Example 1, except that the amount of water added to the solution which had been obtained by distilling off a mixture of water and ethanol was changed to 480 g. The coating composition contained 567.6 g of water and 46.8 g of ethanol. In the coating composition, the weight ratio (WR) of water to the silica precursor was 2.7, and the weight ratio of water to ethanol was 12.1, which means that, in the coating composition, the weight of water was larger than that of ethanol.

Using the coating composition, a porous silica thin film having a thickness of 0.92 μm was obtained in substantially the same manner as in Example 1.

The obtained porous silica thin film had an excellent surface smoothness. Specifically, the porous silica thin film exhibited a surface roughness of 16 Å. The porous silica thin film had a relative dielectric constant of 2.1.

EXAMPLE 4

A mixture of 1,480 g of methyltriethoxysilane, 480 g of tetraethoxysilane, 523 g of water, 869 g of an 80% by weight aqueous solution of MM500 and 120 ml of a water-wetted, sulfonic acid type cation exchange resin (containing 92 g of water) (trade name: AMBERLYST RCP-160M) (manufactured and sold by Mitsubishi Chemical Corporation, Japan) was subjected to a pretreatment of stirring at 50° C. for 8 hours, followed by recovering the cation exchange resin by filtration, thereby obtaining a solution. Using 1,060.1 g of the solution, 1,572.1 g of a coating composition was prepared in substantially the same manner as in Example 1. The coating composition contained 119.0 g of water and 45.3 g of ethanol. In the coating composition, the weight ratio (WR) of the water to the silica precursor was 0.6, and the weight ratio of the water to the ethanol was 2.6, which means that, in the coating composition, the weight of water was larger than that of ethanol.

Using the coating composition, a porous silica thin film having a thickness of 0.99 μm was obtained in substantially the same manner as in Example 1.

The obtained porous silica thin film had an excellent surface smoothness. Specifically, the porous silica thin film exhibited a surface roughness of 13 Å. The porous silica thin film had a relative dielectric constant of 2.0, which was much smaller than that of $SiO_2$ (4.5).

EXAMPLE 5

A mixture of 1,480 g of methyltriethoxysilane, 480 g of tetraethoxysilane, 523 g of water and 120 ml of a water-wetted, sulfonic acid type cation exchange resin (containing 92 g of water) (trade name: AMBERLYST RCP-160M) (manufactured and sold by Mitsubishi Chemical Corporation, Japan) was subjected to a pretreatment of stirring at 50° C. for 8 hours, followed by recovering the cation exchange resin by filtration, thereby obtaining a solution. To 791 g of the obtained solution was added 267.0 g of an 80% by weight aqueous solution of MM500 as an organic polymer to obtain 1,057.0 g of a solution. To the obtained solution were added 963 g of propylene glycol methyl ether acetate, 475.0 g of ethanol and 1,784.0 g of water, thereby obtaining 4,279.0 g of a coating composition. The coating composition contained 1,899.4 g of water and 951.2 g of ethanol. In the coating composition, the weight ratio (WR) of the water to the silica precursor was 8.9, and the weight ratio of the water to the ethanol was 2.0, which means that, in the coating composition, the weight of water was larger than that of ethanol.

Using the coating composition, a porous silica thin film having a thickness of 0.42 μm was obtained in substantially the same manner as in Example 1.

The obtained porous silica thin film had an excellent surface smoothness. Specifically, the porous silica thin film exhibited a surface roughness of 20 Å. The porous silica thin film had a relative dielectric constant of 2.1.

EXAMPLE 6

A coating composition (2,880.0 g) was prepared in substantially the same manner as in Example 5, except that, the amounts of ethanol and water added to the solution which had been obtained by addition of an MM500 aqueous solution were changed to 700.1 g and 160.0 g, respectively, wherein the amount of propylene glycol methyl ether acetate added to the solution was the same as in Example 5, that is, 963 g. The coating composition contained 998.2 g of water and 449.3 g of ethanol. In the coating composition, the weight ratio (WR) of the water to the silica precursor was 4.7, and the weight ratio of the water to the ethanol was 2.2, which means that, in the coating composition, the weight of water was larger than that of ethanol.

Using the coating composition, a porous silica thin film having a thickness of 0.49 μm was obtained in substantially the same manner as in Example 1.

The obtained porous silica thin film had an excellent surface smoothness. Specifically, the porous silica thin film exhibited a surface roughness of 25 Å. The porous silica thin film had a relative dielectric constant of 2.1.

COMPARATIVE EXAMPLE 1

A coating composition (2,049.1 g) was prepared in substantially the same manner as in Example 1, except that distilling off of water and ethanol from a solution was not conducted. The coating composition contained 162.3 g of water and 431.6 g of ethanol. In the coating composition, the weight ratio (WR) of the water to the silica precursor was 0.8, and the weight ratio of the water to the ethanol was 0.4, which means that, in the coating composition, the weight of water was smaller than that of ethanol.

Using the coating composition, a porous silica thin film having a thickness of 0.87 μm was obtained in substantially the same manner as in Example 1.

The porous silica thin film exhibited a surface roughness as high as 357 Å, and the surface of the porous silica thin film was so uneven that the presence of radial streaks in the surface of the porous silica thin film could be recognized even by visual observation. The porous silica thin film had a relative dielectric constant of 2.2.

COMPARATIVE EXAMPLE 2

A solution (579.4 g) was obtained by distilling off a mixture of water and ethanol in substantially the same manner as in Example 1. To the thus obtained solution were added 963 g of propylene glycol methyl ether acetate and 3,200 g of water for the purpose of preparing a coating composition. However, the resultant mixture became white turbid, so that the mixture could not be coated on a silicon wafer.

EXAMPLE 7

A mixture of 1,480 g of methyltriethoxysilane, 480 g of tetraethoxysilane, 615 g of water and 5.7 g of an 85% by weight aqueous solution of phosphoric acid was subjected to a pretreatment of stirring at 50° C. for 8 hours to thereby obtaining a solution. To 100 g of the obtained solution was added 33.8 g of an 80% by weight aqueous solution of MM600 as an organic polymer to obtain 133.8 g of a solution. The obtained solution was subjected to a reduced pressure treatment at 50° C. for 1 hour by means of a rotary evaporator to distill off 68.8 g of a mixture of water and ethanol, thereby obtaining 65.0 g of a solution. To the obtained solution were added 162 g of propylene glycol methyl ether acetate, 13.3 g of water and 4.6 g of ethanol, thereby obtaining 244.9 g of a coating composition. The coating composition contained 16.6 g of water and 10.0 g of ethanol. In the coating composition, the weight ratio (WR) of the water to the silica precursor was 0.6, and the weight ratio of the water to the ethanol was 1.7, which means that, in the coating composition, the weight of water was larger than that of ethanol.

Using the coating composition, a porous silica thin film having a thickness of 0.64 μm was obtained in substantially the same manner as in Example 1. The temperature Ta of MM600 was 255° C.

The obtained porous silica thin film had an excellent surface smoothness. Specifically, the porous silica thin film exhibited a surface roughness of 12 Å. The porous silica thin film had a relative dielectric constant of 2.0, which was much smaller than that of $SiO_2$ (4.5).

EXAMPLE 8

A coating composition (244.0 g) was prepared in substantially the same manner as in Example 7, except that a polyethylene glycol diacetate having a number average molecular weight of 400 was used as an organic polymer. The coating composition contained 16.6 g of water and 10.0 g of ethanol. In the coating composition, the weight ratio (WR) of the water to the silica precursor was 0.6, and the weight ratio of the water to the ethanol was 1.7, which means that, in the coating composition, the weight of water was larger than that of ethanol.

Using the coating composition, a porous silica thin film having a thickness of 0.61 μm was obtained in substantially the same manner as in Example 5.

The obtained porous silica thin film had an excellent surface smoothness. Specifically, the porous silica thin film exhibited a surface roughness of 20 Å. The porous silica thin film had a relative dielectric constant of 2.1.

EXAMPLE 9

A porous silica thin film having a thickness of 0.61 μm was prepared in substantially the same manner as in Example 7, except that the oxygen concentration of the nitrogen gas atmosphere which was measured at an exhaust port in the 200° C. calcination of the thin film of the coating composition was changed to 500 ppm by volume. The temperature Ta of MM600 was 240° C. as measured using this atmosphere.

The obtained porous silica thin film had an excellent surface smoothness. Specifically, the porous silica thin film exhibited a surface roughness of 14 Å. The porous silica thin film had a relative dielectric constant of 2.0.

EXAMPLE 10

A porous silica thin film having a thickness of 0.65 μm was prepared in substantially the same manner as in Example 9, except that the oxygen concentration of the atmosphere which was measured at an exhaust port in the 200° C. calcination of the thin film of the coating composition was changed to 100 ppm by volume. The temperature Ta of MM600 was 250° C. as measured in this atmosphere.

The obtained porous silica thin film had an excellent surface smoothness. Specifically, the porous silica thin film exhibited a surface roughness of 13 Å. The porous silica thin film had a relative dielectric constant of 2.0.

EXAMPLE 11

A porous silica thin film having a thickness of 0.64 μm was prepared in substantially the same manner as in Example 7, except that the temperature at which the thin film of the coating composition is calcined for 1 hour in a nitrogen atmosphere was changed from 200° C. to 150° C.

The obtained porous silica thin film had an excellent surface smoothness. Specifically, the porous silica thin film exhibited a surface roughness of 11 Å. The porous silica thin film had a relative dielectric constant of 2.0.

EXAMPLE 12

A porous silica thin film having a thickness of 0.55 μm was prepared in substantially the same manner as in Example 7, except that the temperature at which the coating composition was spin-coated was changed from 23° C. to 30° C.

The obtained porous silica thin film had an excellent surface smoothness. Specifically, the porous silica thin film exhibited a surface roughness of 17 Å. The porous silica thin film had a relative dielectric constant of 2.1.

EXAMPLE 13

A porous silica thin film having a thickness of 0.45 μm was prepared in substantially the same manner as in Example 7, except that the revolution rate at which the coating composition was spin-coated was changed from 2,000 rpm to 3,000 rpm.

The obtained porous silica thin film had an excellent surface smoothness. Specifically, the porous silica thin film exhibited a surface roughness of 20 Å. The porous silica thin film had a relative dielectric constant of 2.1.

COMPARATIVE EXAMPLE 3

A porous silica thin film having a thickness of 0.60 μm was prepared in substantially the same manner as in Example 7, except that the oxygen concentration of the atmosphere which was measured at an exhaust port in the 200° C. calcination of the thin film of the coating composition was changed to 6,000 ppm by volume.

The obtained porous silica thin film had a very poor surface smoothness. Specifically, the porous silica thin film exhibited a surface roughness of 680 Å. The porous silica thin film had a relative dielectric constant of 2.8.

EXAMPLE 14

A mixture of 91.8 g of methyltriethoxysilane, 107.3 g of tetraethoxysilane, 64.9 g of water and 0.6 g of an 85% by weight aqueous solution of phosphoric acid was subjected to a pretreatment of stirring at 50° C. for 6 hours, thereby obtaining a solution. To 100.0 g of the obtained solution was added 31.0 g of an 80% by weight aqueous solution of MM600 as an organic polymer to obtain 131.0 g of a solution. The obtained solution was subjected to a reduced pressure treatment at 50° C. for 1 hour by means of a rotary evaporator to distill off 63.8 g of a mixture of water and ethanol, thereby obtaining 67.2 g of a solution. To the obtained solution were added 119.8 g of propylene glycol methyl ether acetate and 6.3 g of water, thereby obtaining a coating composition. The coating composition contained 13.1 g of water and 8.1 g of ethanol. In the coating composition, the weight ratio (WR) of the water to the silica precursor was 0.5, and the weight ratio of the water to the ethanol was 1.6, which means that, in the coating composition, the weight of water was larger than that of ethanol.

Using the coating composition, a porous silica thin film having a thickness of 0.90 μm was obtained in substantially the same manner as in Example 1.

The obtained porous silica thin film had an excellent surface smoothness. Specifically, the porous silica thin film exhibited a surface roughness of 20 Å. The porous silica thin film had a relative dielectric constant of 2.1, which was much smaller than that of $SiO_2$ (4.5).

EXAMPLE 15

A coating composition was prepared in substantially the same manner as in Example 14, except that the amounts of methyltriethoxysilane and tetraethoxysilane were changed to 128.0 g and 64.4 g, respectively. In the coating composition, the weight ratio (WR) of the water to the silica precursor was 0.5, and the weight ratio of the water to the ethanol was 1.6, which means that, in the coating composition, the weight of water was larger than that of ethanol.

Using the coating composition, a porous silica thin film having a thickness of 0.91 μm was obtained in substantially the same manner as in Example 1.

The obtained porous silica thin film had an excellent surface smoothness. Specifically, the porous silica thin film exhibited a surface roughness of 17 Å. The porous silica thin film had a relative dielectric constant of 2.1.

EXAMPLE 16

A coating composition was prepared in substantially the same manner as in Example 14, except that the amounts of methyltriethoxysilane and tetraethoxysilane were changed to 36.7 g and 171.7 g, respectively. In the coating composition, the weight ratio (WR) of the water to the silica precursor was 0.5, and the weight ratio of the water to the ethanol was 1.6, which means that, in the coating composition, the weight of water was larger than that of ethanol.

Using the coating composition, a porous silica thin film having a thickness of 0.93 μm was obtained in substantially the same manner as in Example 1.

The obtained porous silica thin film had an excellent surface smoothness. Specifically, the porous silica thin film exhibited a surface roughness of 25 Å. The porous silica thin film had a relative dielectric constant of 2.3.

EXAMPLE 17

A coating composition was prepared in substantially the same manner as in Example 14, except that the amounts of methyltriethoxysilane and tetraethoxysilane were changed to 183.6 g and 0 g, respectively. In the coating composition, the weight ratio (WR) of the water to the silica precursor was 0.6, and the weight ratio of the water to the ethanol was 1.6, which means that, in the coating composition, the weight of water was larger than that of ethanol.

Using the coating composition, a porous silica thin film having a thickness of 0.89 μm was obtained in substantially the same manner as in Example 1.

The obtained porous silica thin film had an excellent surface smoothness. Specifically, the porous silica thin film exhibited a surface roughness of 15 Å. The porous silica thin film had a relative dielectric constant of 2.0.

EXAMPLE 18

A coating composition (309.0 g) was prepared in substantially the same manner as in Example 7, except that the amounts of water and ethanol added to the solution which had been obtained by distilling off a mixture of water and ethanol were changed to 58.0 g and 24.0 g, respectively. The coating composition contained 62.1 g of water and 28.3 g of ethanol. In the coating composition, the weight ratio (WR) of the water to the silica precursor was 2.3, and the weight ratio of the water to the ethanol was 2.2, which means that, in the coating composition, the weight of water was larger than that of ethanol.

Using the coating composition, a porous silica thin film having a thickness of 0.64 μm was obtained in substantially the same manner as in Example 1.

The obtained porous silica thin film had an excellent surface smoothness. Specifically, the porous silica thin film exhibited a surface roughness of 13 Å. The porous silica thin film had a relative dielectric constant of 2.0, which was much smaller than that of $SiO_2$ (4.5).

EXAMPLE 19

A thin film of a coating composition was prepared in substantially the same manner as in Example 7. The thin film was preheated at 120° C. for 1 minute. The preheated thin film was calcined at 200° C. for 1 hour in an atmosphere of nitrogen gas to obtain a silica/organic polymer composite thin film having a thickness of 0.70 μm.

The obtained silica/organic polymer composite thin film had an excellent surface smoothness. Specifically, the porous silica thin film exhibited a surface roughness of 13 Å. The silica/organic polymer composite thin film had a relative dielectric constant of 2.3, which was much smaller than that of $SiO_2$ (4.5).

EXAMPLE 20

A coating composition (244.0 g) was prepared in substantially the same manner as in Example 7, except that a glycerol polyethylene glycol trimethyl ether having a number average molecular weight of 600 was used as an organic polymer. The coating composition contained 16.9 g of water and 10.2 g of ethanol. In the coating composition, the weight ratio (WR) of the water to the silica precursor was 0.6, and the weight ratio of the water to the ethanol was 1.6, which means that, in the coating composition, the weight of water was larger than that of ethanol.

Using the coating composition, a porous silica thin film having a thickness of 0.61 μm was obtained in substantially the same manner as in Example 7.

The obtained porous silica thin film had an excellent surface smoothness. Specifically, the porous silica thin film exhibited a surface roughness of 12 Å. The porous silica thin film had a relative dielectric constant of 2.0.

EXAMPLE 21

A coating composition (244.0 g) was prepared in substantially the same manner as in Example 7, except that glycerol polyethylene glycol triacetate having a number average molecular weight of 600 was used as an organic polymer. The coating composition contained 16.0 g of water and 9.5 g of ethanol. In the coating composition, the weight ratio (WR) of the water to the silica precursor was 0.6, and the weight ratio of the water to the ethanol was 1.7, which means that, in the coating composition, the weight of water was larger than that of ethanol.

Using the coating composition, a porous silica thin film having a thickness of 0.63 μm was obtained in substantially the same manner as in Example 7.

The obtained porous silica thin film had an excellent surface smoothness. Specifically, the porous silica thin film exhibited a surface roughness of 13 Å. The porous silica thin film had a relative dielectric constant of 2.0.

EXAMPLE 22

A mixture of 1,480 g of methyltriethoxysilane, 480 g of tetraethoxysilane, 615 g of water and 5.7 g of an 85% by weight aqueous solution of phosphoric acid was subjected to a pretreatment of stirring at 50° C. for 8 hours to thereby obtaining a solution. To 100 g of the obtained solution was added 16.9 g of an 80% by weight aqueous solution of MM600 as an organic polymer to obtain a solution. The obtained solution was subjected to a reduced pressure treatment at 50° C. for 1 hour by means of a rotary evaporator to distill off 65.4 g of a mixture of water and ethanol, thereby obtaining 65.0 g of a solution. To the obtained solution were added 162 g of propylene glycol methyl ether acetate, 13.3 g of water and 4.6 g of ethanol, thereby obtaining 231.4 g of a coating composition. The coating composition contained 17.2 g of water and 10.1 g of ethanol. In the coating composition, the weight ratio (WR) of the water to the silica precursor was 0.6, and the weight ratio of the water to the ethanol was 1.7, which means that, in the coating composition, the weight of water was larger than that of ethanol. Further, the coating composition position had a polymer ratio of 0.5.

Using the coating composition, a porous silica thin film having a thickness of 0.58 μm was obtained in substantially the same manner as in Example 1.

The obtained porous silica thin film had an excellent surface smoothness. Specifically, the porous silica thin film exhibited a surface roughness of 15 Å. The porous silica thin film had a relative dielectric constant of 2.3, which was much smaller than that of $SiO_2$ (4.5).

EXAMPLE 23

A coating composition was prepared in substantially the same manner as in Example 22, except that the amount of the 80% by weight of aqueous solution of MM600 was 50.7 g, and that the amount of a mixture of water and ethanol distilled off by a reduced pressure treatment at 50° C. for 1 hour by means of a rotary evaporator was 72.2 g. The coating composition contained 16.7 g of water and 10.0 g of ethanol. In the coating composition, the weight ratio (WR) of the water to the silica precursor was 0.6, and the weight ratio of the water to the ethanol was 1.7, which means that, in the coating composition, the weight of water was larger than that of ethanol. Further, the coating composition had a polymer ratio of 1.5.

Using the coating composition, a porous silica thin film having a thickness of 0.77 μm was obtained in substantially the same manner as in Example 1.

The obtained porous silica thin film had an excellent surface smoothness. Specifically, the porous silica thin film exhibited a surface roughness of 15 Å. The porous silica thin film had a relative dielectric constant of 1.7, which was much smaller than that of $SiO_2$ (4.5).

EXAMPLE 24

A coating composition was prepared in substantially the same manner as in Example 22, except that the amount of the 80% by weight of aqueous solution of MM600 was 67.6 g, and that the amount of a mixture of water and ethanol distilled off by a reduced pressure treatment at 50° C. for 1 hour by means of a rotary evaporator was 75.6 g. The coating composition contained 16.2 g of water and 9.8 g of ethanol. In the coating composition, the weight ratio (WR) of the water to the silica precursor was 0.6, and the weight ratio of the water to the ethanol was 1.7, which means that, in the coating composition, the weight of water was larger than that of ethanol. Further, the coating composition had a polymer ratio of 2.0.

Using the coating composition, a porous silica thin film having a thickness of 0.88 μm was obtained in substantially the same manner as in Example 1.

The obtained porous silica thin film had an excellent surface smoothness. Specifically, the porous silica thin film exhibited a surface roughness of 15 Å. The porous silica thin film had a relative dielectric constant of 1.5, which was much smaller than that of SiO$_2$ (4.5).

EXAMPLE 25

A coating composition was prepared in substantially the same manner as in Example 7, except that the distilling off of a mixture of water and ethanol was conducted by means of a wiped film evaporator (F-70, manufactured and sold by Tokyo Rikakiki, Japan) under conditions wherein the flow rate was 5 liter/min, the pressure was 50 Torr, the jacket temperature was 50° C. and the revolution rate was 800 rpm. The coating composition contained 16.5 g of water and 10.2 g of ethanol. In the coating composition, the weight ratio (WR) of the water to the silica precursor was 0.6, and the weight ratio of the water to the ethanol was 1.6, which means that, in the coating composition, the weight of water was larger than that of ethanol.

A porous silica thin film having a thickness of 0.62 μm was obtained in substantially the same manner as in Example 1.

The obtained porous silica thin film had an excellent surface smoothness. Specifically, the porous silica thin film exhibited a surface roughness of 12 Å. The porous silica thin film had a relative dielectric constant of 2.0.

EXAMPLE 26

A coating composition was prepared in substantially the same manner as in Example 7, except that, instead of applying a solution obtained by adding 33.8 g of an 80% by weight aqueous solution of an organic polymer MM600 to a rotary evaporator, the solution was treated with a filtration apparatus equipped with an ultrafiltration membrane (PS4001, manufactured and sold by Asahi Kasei Corporation, Japan) under conditions wherein the solution was circulated at a flow rate of 0.5 liter/min for 1 hour, to thereby remove the water and ethanol by filtration and obtain a coating composition. The coating composition contained 16.6 g of water and 10.5 g of ethanol. In the coating composition, the weight ratio (WR) of the water to the silica precursor cursor was 0.6, and the weight ratio of the water to the ethanol was 1.6, which means that, in the coating composition, the weight of water was larger than that of ethanol.

A porous silica thin film having a thickness of 0.62 μm was obtained in substantially the same manner as in Example 1.

The obtained porous silica thin film had an excellent surface smoothness. Specifically, the porous silica thin film exhibited a surface roughness of 13 Å. The porous silica thin film had a relative dielectric constant of 2.0.

TABLE

| | Production conditions | | | | | Composition of the coating composition | | Film forming | Properties of the thin film | |
|---|---|---|---|---|---|---|---|---|---|---|
| | | | | | | Water/ | | Conditions | | Surface |
| | Alkoxysilane | Molar ratio | Catalyst | Polymer | Polymer ratio | silica (WR) | Water/ alcohol | Coating and calcination conditions | k | roughness (Å) |
| Ex. 1 | MTES/ TEOS | 7.8/2.2 | ion exchange resin | MM500 | 1.0 | 0.6 | 2.5 | Coating temperature: 23° C.; revolution rate: 2000 rpm; calcination conditions: 200° C./400° C./ nitrogen atmosphere | 2.0 | 13 |
| Ex. 2 | MTES/ TEOS | 7.8/2.2 | ion exchange resin | Polyethylene glycol monomethacrylate | 1.0 | 0.6 | 2.9 | Calcination at 200° C./450° C. | 2.1 | 20 |
| Ex. 3 | MTES/ TEOS | 7.8/2.2 | ion exchange resin | MM500 | 1.0 | 2.7 | 12.1 | Substantially the same conditions as in Example 1 | 2.1 | 16 |
| Ex. 4 | MTES/ TEOS | 7.8/2.2 | ion exchange resin | MM500 | 1.0 | 0.6 | 2.6 | Substantially the same conditions as in Example 1 | 2.0 | 13 |
| Ex. 5 | MTES/ TEOS | 7.8/2.2 | ion exchange resin | MM500 | 1.0 | 8.9 | 2.0 | Substantially the same conditions as in Example 1 | 2.1 | 20 |
| Ex. 6 | MTES/ TEOS | 7.8/2.2 | ion exchange resin | MM500 | 1.0 | 4.7 | 2.1 | Substantially the same conditions as in Example 1 | 2.1 | 25 |

TABLE-continued

| | | | | | | | | | | |
|---|---|---|---|---|---|---|---|---|---|---|
| Com. Ex. 1 | MTES/ TEOS | 7.8/2.2 | ion exchange resin | MM500 | 1.0 | 0.8 | 0.4 | Substantially the same conditions as in Example 1 | 2.2 | 357 |

| | Production conditions | | | | Composition of the coating composition | | Film forming conditions | Properties of the thin film | |
|---|---|---|---|---|---|---|---|---|---|
| | | | | | Water/ | | | | Surface |
| | Alkoxysilane | Molar ratio | Catalyst | Polymer | Polymer ratio | silica (WR) | Water/ alcohol | Coating and calcination conditions | $k$ | roughness (Å) |
| Com. Ex. 2 | MTES/ TEOS | 7.8/2.2 | ion exchange resin | MM500 | 1.0 | Gelation | | — | — | — |
| Ex. 7 | MTES/ TEOS | 7.8/2.2 | Phosphoric acid | MM600 | 1.0 | 0.6 | 1.7 | Substantially the same conditions as in Example 1 | 2.0 | 12 |
| Ex. 8 | MTES/ TEOS | 7.8/2.2 | Phosphoric acid | Polyethylene glycol diacetate | 1.0 | 0.6 | 1.7 | Substantially the same conditions as in Example 1 | 2.1 | 20 |
| Ex. 9 | MTES/ TEOS | 7.8/2.2 | Phosphoric acid | MM600 | 1.0 | 0.6 | 1.7 | Oxygen concentration: 500 ppm | 2.0 | 14 |
| Ex. 10 | MTES/ TEOS | 7.8/2.2 | Phosphoric acid | MM600 | 1.0 | 0.6 | 1.7 | Oxygen concentration: 100 ppm | 2.0 | 13 |
| Ex. 11 | MTES/ TEOS | 7.8/2.2 | Phosphoric acid | MM600 | 1.0 | 0.6 | 1.7 | Calcination at 150° C./ 400° C. | 2.0 | 11 |
| Ex. 12 | MTES/ TEOS | 7.8/2.2 | Phosphoric acid | MM600 | 1.0 | 0.6 | 1.7 | Coating temperature: 30° C. | 2.1 | 17 |
| Ex. 13 | MTES/ TEOS | 7.8/2.2 | Phosphoric acid | MM600 | 1.0 | 0.6 | 1.7 | Revolution rate: 3000 rpm | 2.1 | 20 |
| Com. Ex. 3 | MTES/ TEOS | 7.8/2.2 | Phosphoric acid | MM600 | 1.0 | 0.6 | 1.7 | Oxygen concentration: 6000 ppm | 2.8 | 680 |
| Ex. 14 | MTES/ TEOS | 5.0/5.0 | Phosphoric acid | MM600 | 1.0 | 0.5 | 1.6 | Substantially the same conditions as in Example 1 | 2.1 | 20 |
| Ex. 15 | MTES/ TEOS | 7.0/3.0 | Phosphoric acid | MM600 | 1.0 | 0.5 | 1.6 | Substantially the same conditions as in Example 1 | 2.1 | 17 |

| | Production conditions | | | | Composition of the coating composition | | Film forming conditions | Properties of the thin film | |
|---|---|---|---|---|---|---|---|---|---|
| | | | | | Water/ | | | | Surface |
| | Alkoxysilane | Molar ratio | Catalyst | Polymer | Polymer ratio | silica (WR) | Water/ alcohol | Coating and calcination conditions | $k$ | roughness (Å) |
| Ex. 16 | MTES/ TEOS | 2.0/8.0 | Phosphoric acid | MM600 | 1.0 | 0.5 | 1.6 | Substantially the same conditions as in Example 1 | 2.3 | 25 |
| Ex. 17 | MTES/ TEOS | 10/0.0 | Phosphoric acid | MM600 | 1.0 | 0.6 | 1.6 | Substantially the same conditions as in Example 1 | 2.0 | 15 |
| Ex. 18 | MTES/ TEOS | 7.8/2.2 | Phosphoric acid | MM600 | 1.0 | 2.3 | 2.2 | Substantially the same conditions as in Example 1 | 2.0 | 13 |
| Ex. 19 | MTES/ TEOS | 7.8/2.2 | Phosphoric acid | MM600 | 1.0 | 0.6 | 1.7 | Calcination at 200° C. | 2.8 | 12 |
| Ex. 20 | MTES/ TEOS | 7.8/2.2 | Phosphoric acid | Glycerol polyethylene glycol trimethyl ether | 1.0 | 0.6 | 1.7 | Substantially the same conditions as in Example 1 | 2.0 | 12 |
| Ex. 21 | MTES/ TEOS | 7.8/2.2 | Phosphoric acid | Glycerol polyethylene glycol triacetatee | 1.0 | 0.6 | 1.7 | Substantially the same conditions as in Example 1 | 2.0 | 12 |
| Ex. 22 | MTES/ TEOS | 7.8/2.2 | Phosphoric acid | MM600 | 0.5 | 0.6 | 1.7 | Substantially the same conditions as in Example 1 | 2.3 | 15 |
| Ex. 23 | MTES/ TEOS | 7.8/2.2 | Phosphoric acid | MM600 | 1.5 | 0.6 | 1.7 | Substantially the same conditions as in Example 1 | 1.9 | 15 |
| Ex. 24 | MTES/ TEOS | 7.8/2.2 | Phosphoric acid | MM600 | 2.0 | 0.6 | 1.7 | Substantially the same conditions as in Example 1 | 1.7 | 15 |
| Ex. 25 | MTES/ TEOS | 7.8/2.2 | Phosphoric acid | MM600 | 1.0 | 0.6 | 1.6 | Substantially the same conditions as in Example 1 | 2.0 | 12 |
| Ex. 26 | MTES/ TEOS | 7.8/2.2 | Phosphoric acid | MM600 | 1.0 | 0.6 | 1.6 | Substantially the same conditions as in Example 1 | 2.0 | 13 |

INDUSTRIAL APPLICABILITY

The silica/organic polymer composite thin film and porous silica thin film, each of which is produced from the coating composition of the present invention, not only have an improved mechanical strength, and have an insulating property and a low dielectric constant, but also exhibit excellent surface smoothness. Therefore, the silica/organic polymer composite thin film and porous silica thin film of the present invention can be advantageously used for producing an excellent multi-level interconnect, an excellent semiconductor device and the like.

What is claimed is:

1. A coating composition for use in producing an insulating thin film, comprising:
   (A) at least one silica precursor selected from the group consisting of the following silica precursors (A-1) and (A-2):
      a silica precursor (A-1) comprised of at least one compound selected from the group consisting of an alkoxysilane represented by the following formula (1) and a hydrolysis product thereof:

      $$R^1{}_n Si(OR^2)_{4-n} \qquad (1)$$

wherein each $R^1$ independently represents a hydrogen atom, a straight chain or branched alkyl group having 1 to 6 carbon atoms, a vinyl group or a phenyl group, each $R^2$ independently represents a straight chain or branched alkyl group having 1 to 6 carbon atoms and n represents an integer of from 0 to 3; and
      a silica precursor (A-2) comprised of at least one compound selected from the group consisting of an alkoxysilane represented by the following formula (2) and a hydrolysis product thereof:

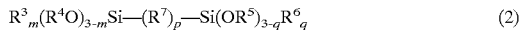
      $$R^3{}_m(R^4O)_{3-m}Si-(R^7)_p-Si(OR^5)_{3-q}R^6{}_q \qquad (2)$$

wherein each $R^3$ independently represents a hydrogen atom, a straight chain or branched alkyl group having 1 to 6 carbon atoms, a vinyl group or a phenyl group, each $R^4$ independently represents a straight chain or branched alkyl group having 1 to 6 carbon atoms, each $R^5$ independently represents a straight chain or branched alkyl group having 1 to 6 carbon atoms, each $R^6$ independently represents a hydrogen atom, a straight chain or branched alkyl group having 1 to 6 carbon atoms, a vinyl group or a phenyl group, $R^7$ represents an oxygen atom, a phenylene group or a group represented by the formula: $-(CH_2)_r-$ wherein r represents an integer of from 1 to 6, each of m and q independently represents an integer of from 0 to 2, and p represents 0 or 1;
   (B) at least one organic polymer;
   (C) water;
   (D) at least one alcohol;
   (F) phosphoric acid; and optionally
   (E) an organic solvent for a mixture of said components (A), (B), (C), (D) and (F);
   wherein the weight ratio (WR) of said water (C) to said at least one silica precursor (A) satisfies the formula 0.01<WR<10, and the weight of said water (C) is larger than that of said at least one alcohol (D),
   with the proviso that when said at least one organic polymer (B) is insoluble in a mixture of said water (C) and said alcohol (D), said coating composition comprises all of said components (A), (B), (C), (D), (F) and (E).

2. The composition according to claim 1, wherein the weight ratio (WR) satisfies the formula 0.1<WR<10.

3. The composition according to claim 1 or 2, wherein the weight ratio of said water (C) to said alcohol (D) is 5 or less.

4. The composition according to claim 1, wherein said organic polymer (B) is at least one member selected from the group consisting of:
   (B-1) an organic polymer having at least one polymerizable functional group in a molecule thereof; and
   (B-2) an organic polymer having at least one terminal group which is inert to said silica precursor (A).

5. The composition according to claim 4, wherein said terminal group of said organic polymer (B-2) is an alkyl ether group.

6. The composition according to claim 1, wherein said organic polymer (B) has a number average molecular weight of from 200 to 1,000,000.

7. The composition according to claim 1, wherein said organic polymer (B) is present in an amount of from 0.01 to 10 parts by weight, relative to 1 part by weight of a product obtained by gelation of the whole amount of said silica precursor (A).

8. The composition according to claim 1, wherein said silica precursor (A) has at least one Si—O—P— linkage which is formed by a reaction thereof with said phosphoric acid (F).

9. A silica/organic polymer composite thin film, which is produced by a process comprising:
   coating the composition of claim 1 on a substrate to form a thin film of the composition on the substrate, and
   subjecting said thin film to gelation with respect to said silica precursor (A) to thereby obtain a silica/organic polymer composite thin film.

10. A porous silica thin film which is obtained by removing said organic polymer (B) from the silica/organic polymer composite thin film of claim 9.

11. A multilevel interconnect comprising a plurality of insulating layers and circuits formed on said insulating layers, wherein at least one layer of said insulating layers comprises the thin film of claim 9 or 10.

12. A semiconductor device comprising the multilevel interconnect of claim 11.

13. A method for producing a porous silica thin film, which comprises the steps of:
   (1) coating the composition of claim 1 on a substrate to form a thin film of the composition on the substrate,
   (2) heating said thin film at a temperature $T_1$ satisfying the formula 60° C.<$T_1$<Ta in an atmosphere of inert gas having an oxygen concentration of not higher than 5% by volume, wherein Ta represents the temperature at which a 1% by weight decrease in weight of said at least one organic polymer (B) is reached when said at least one organic polymer (B) is heated at a temperature elevation rate of 10° C./min in an atmosphere of inert gas, wherein the inert gas is fed at a feeding rate of 40 ml/min, to thereby effect gelation of said silica precursor (A) and obtain a silica/organic polymer composite thin film, and
   (3) heating said composite thin film at a temperature $T_2$ satisfying the formula Ta≦$T_2$≦450° C., wherein Ta is as defined above, in an atmosphere of inert gas having an oxygen concentration of not higher than 5% by volume, to thereby remove said organic polymer (B) from said composite thin film.

* * * * *